United States Patent
Danny et al.

(10) Patent No.: US 8,988,119 B2
(45) Date of Patent: Mar. 24, 2015

(54) SYSTEM, A METHOD AND A COMPUTER PROGRAM PRODUCT FOR ELECTRONIC SUB-INTEGER FREQUENCY DIVISION

(71) Applicant: International Business Machines Corporation, Armonk, NY (US)

(72) Inventors: Elad Danny, Moshav Liman (IL); Oded Katz, Ganei-Tikva (IL); Run Levinger, Tel Aviv (IL)

(73) Assignee: International Business Machines Corporation, Armonk, NY (US)

( * ) Notice: Subject to any disclaimer, the term of this patent is extended or adjusted under 35 U.S.C. 154(b) by 22 days.

(21) Appl. No.: 13/727,642

(22) Filed: Dec. 27, 2012

(65) Prior Publication Data

US 2014/0184281 A1    Jul. 3, 2014

(51) Int. Cl.
- H03K 21/00    (2006.01)
- H03B 19/00    (2006.01)
- H03L 7/18    (2006.01)

(52) U.S. Cl.
CPC .................................. *H03L 7/1803* (2013.01)
USPC ........................................... 327/115; 327/117

(58) Field of Classification Search
USPC .................. 327/115, 117, 254, 255
See application file for complete search history.

(56) References Cited

U.S. PATENT DOCUMENTS

| | | | |
|---|---|---|---|
| 7,486,145 B2 | 2/2009 | Floyd et al. | |
| 7,620,140 B2 | 11/2009 | Chiu et al. | |
| 7,777,534 B2 | 8/2010 | Kuan | |
| 7,965,808 B2 | 6/2011 | Marutani | |
| 7,969,209 B2 | 6/2011 | Badillo | |
| 2008/0164917 A1* | 7/2008 | Floyd et al. | 327/117 |
| 2010/0225361 A1 | 9/2010 | Rhee et al. | |
| 2012/0001665 A1 | 1/2012 | Regimbal et al. | |

OTHER PUBLICATIONS

Brian A. Floyd, "Sub-Integer Frequency Synthesis Using Phase-Rotating Frequency Dividers", IEEE Transactions on Circuits and Systems I:Regular Papers, vol. 55, Issue: 7, pp. 1823-1833, Aug. 2008.

Pellerano et al., "A 4.75-ghz fractional frequency divider-by-1.25 with TDC-based all-digital spur calibration in 45-nm CMOS", IEEE Journal of Solid-State Circuits, vol. 44, Issue: 12, pp. 3422-3433, Dec. 2009.

Jing Jin et al., "Quantization noise suppression in fractional-n PLLs utilizing glitch-free phase switching multi-modulus frequency divider", IEEE Transactions on Circuits and Systems I: Regular Papers, vol. 59, Issue: 5, pp. 926-937, May 2012.

* cited by examiner

*Primary Examiner* — Hai L Nguyen

(57) ABSTRACT

An electronic sub-integer frequency divider circuit, including: a phase rotator circuit, a clock circuitry, a pulse generator which is configured to: (a) receive a plurality of signals having a period TP and of different phases; (b) based on a control command, to process a second clock signal and one or more of the plurality of signals, to produce a second signal which includes S pulses in each period TP; and (c) process the second signal and a first clock signal to produce a regulating signal by which the phase rotator circuit is controlled; and an output interface configured to provide a sub-integer output signal whose frequency is responsive to the regulating signal.

14 Claims, 13 Drawing Sheets

510 processing a first signal that is outputted by a phase-rotator circuit to produce a first clock signal and a second clock signal which is different from the first clock signal 511 processing the first signal by an integer divider to produce the first clock signal 512 processing the first clock signal by an integer divider to produce the second clock signal

FIG. 4B 510 processing a first signal that is outputted by a phase-rotator circuit to produce a first clock signal and a second clock signal which is different from the first clock signal 511 processing the first signal by an integer divider to produce the first clock signal 513 processing the first clock signal by a non-overlapping inverter to produce the second clock signal

FIG. 4C 550 based on a control command, processing the second clock signal and at least one signal having a period TP (e.g. at least one of the M signals), thereby producing a second signal which includes S pulses in each period TP 551 inputting one or more of the M signals to a first-level circuit which includes (a) a plurality of logical gates and (b) a multiplexer M1 which is clocked by the second clock signal, and which is configured to selectively output, based on the control command, each out of a plurality of L possible periodic pulses of different duty cycles and with a period TP, thereby providing one of the L possible signal, whose duty cycle is responsive to the control command.

552 inputting the signal produced in stage 551 with the second clock signal to an AND logical gate which produces the second signal

FIG. 4D

SYSTEM, A METHOD AND A COMPUTER PROGRAM PRODUCT FOR ELECTRONIC SUB-INTEGER FREQUENCY DIVISION

FIELD

This invention relates to systems and methods for electronic sub-integer frequency division, and especially to electronic sub-integer frequency divider circuits, to pulse generators, to methods for sub-integer frequency division in electronic circuits, and to phase-locked loop frequency synthesizers which include electronic sub-integer frequency divider circuits.

BACKGROUND

U.S. Pat. No. 7,486,145 discusses circuits and methods for implementing programmable sub-integer N frequency dividers for use in, e.g., frequency synthesizer applications, providing glitch free outputs signals with minimal fractional spurs. Phase-rotating sub-integer N frequency dividers are programmable to provide multi-modulus division with a wide range of arbitrary sub-integer division ratios.

Phase-locked loop (PLL) circuits are critical components commonly implemented in various communications systems to provide, e.g., LO (local oscillator) signals for transceiver circuits, clock signals for data-recovery circuits, etc. In general, a PLL circuit uses feedback to maintain an outputted signal of the PLL in a specific phase relationship with a reference input signal of the PLL, as is well known in the art. When the output frequency of the PLL is equal to the frequency of the reference input signal, the PLL is in a "locked" condition.

PLL circuits are commonly implemented to construct frequency synthesizer circuits for use in various applications in which it is desirable to generate one or more of a plurality of new clock signals based on a reference clock signal. Essentially, a frequency synthesizer is a PLL that employs a programmable frequency divider in the PLL feedback loop. By way of example, FIG. 1 is a high-level schematic illustration of a conventional PLL frequency synthesizer circuit 10. The PLL frequency synthesizer 10 comprises a PFD (phase-frequency detector) circuit 11, a charge pump 12, a loop filter 13, a VCO (voltage controlled oscillator) circuit 14, and a frequency divider 15 in a PLL feedback loop.

In general, the PLL frequency synthesizer 10 generates an outputted signal $V_{out}$ having a frequency $f_{out}$ that is some multiple N of the frequency $f_{in}$ of a reference clock signal Ref_CLK, where $f_{out}=N \cdot f_{Ref}$. The PFD circuit 11 receives the input reference signal Ref_CLK and a feedback signal $f_{Div}$ and compares the phases of such signals. The PFD 11 generates a slowly varying phase error outputted signal that is a function of the phase difference between the reference and feedback signals. The charge pump 12 operates in conjunction with the PFD (1) to generate an output current signal based on the detected phase difference. The loop filter 13 low-pass filters the phase error signal generated by the PFD 11 and CP 12 and outputs a control voltage to the VCO 14. In general, the charge pump 12 and loop filter 13 operate to amplify and filter the phase error signal output from the PFD 11 according to a filter transfer function that is selected to achieve desired loop characteristics such as gain, bandwidth, frequency response, etc., in a manner well known in the art.

The control voltage output from the loop filter 13 is a control signal that is input to a control port of the VCO 14. The VCO 14 may be a voltage controlled LC tank oscillator where frequency tuning is achieved based on the voltage level of the control signal output from the loop filter 13. The control signal voltage incrementally increases or decreases so as to drive the VCO 14 output frequency $f_{out}$ in the direction of $N \cdot f_{Ref}$. The outputted signal $V_{out}$ is fed back to the PFD 11 via the frequency divider circuit 15, which divides the VCO output frequency by the dividing factor N to generate a low frequency signal $f_{Div}$, where $f_{Ref}=f_{Div}$ when the PLL frequency synthesizer achieves the desired "locked" state.

As noted above, a fundamental function of a PLL is to lock the phase of the outputted signal to the phase of the reference signal. In general, standard Laplace transform theory can be used to show that the PLL tracks the input phase within a certain loop bandwidth, acting as a low-pass filter with respect to the carrier frequency to phase fluctuations on the input reference signal Ref_CLK. From a phase-noise perspective, this means that the phase noise of Ref_CLK is passed within the bandwidth of the loop and actually amplified by the division factor (20·log 10(N)). Similarly, the combined phase noise from the frequency divider 15, the PFD 11, charge pump 12, and the loop filter 13 is amplified by the division factor N within the loop bandwidth.

Conversely, phase noise from the VCO 14 is rejected within the bandwidth of the loop, but is passed outside the bandwidth. In other words, the PLL essentially acts as a high-pass filter with respect to the carrier frequency to phase fluctuations on the VCO 14. In addition to setting the phase-noise profile, the loop bandwidth also determines the locking time of the PLL through a converse relationship, i.e., BW~1/τ. It is noted that the bandwidth cannot be set as arbitrarily large, as loop instabilities can result. Therefore, as a rule of thumb, the loop bandwidth is limited to about an order of magnitude less than the Ref_CLK frequency.

In general, the PLL frequency synthesizer 10 may be implemented as an "integer-N" synthesizer or "fractional-N" synthesizer, depending on the frequency dividing factor N of the frequency divider circuit 15. In particular, with an "integer-N" architecture, the dividing factor N of the frequency divider 15 is selected such that the output frequency of the VCO is only an integer multiple of the reference frequency. Consequently, the reference frequency cannot be higher in frequency than the desired step size (channel resolution). An integer-N PLL synthesizer framework is advantageous in terms of having a simple architecture/design and having fewer spurs in the output spectrum.

On the other hand, a fractional-N synthesizer allows frequencies equal to fractional multiples of the reference frequency $f_{Ref}$ to be synthesized. That is, the dividing factor N of the frequency divider 15 can be a fractional number, which, for a given channel resolution, allows the reference clock to be at a higher frequency. A fractional-N type synthesizer offers several advantages over integer-N synthesizers. First, the loop bandwidth can be increased, since the bandwidth of the loop is usually confined to be about $f_{Ref}/10$ for stability purposes. The larger loop bandwidth results in suppression of the VCO phase noise over a larger range. Secondly, the higher $f_{REF}$ means that the division factor is smaller, resulting in reduced in-band phase noise.

Conventional fractional-N synthesizers can be implemented using various techniques known in the art. For instance, a fractional-N synthesizer may be built using dual-modulus frequency dividers, where the modulus of the divider is switched between two division ratios, N and N+1, whereby the average dividing factor is determined based on the ratio of the time in a predetermined period during which N and N+1 divisors were applied. For example, a dual-modulus divide-by-128/129 frequency divider can be controlled such that it divides by 128 97% of the time and by 129 3% of the time. The overall dividing factor is then 128.03.

With this technique, if the switching between the two division ratios is periodic, then a fractional spur will result, occurring at multiple frequencies of $f_{Ref}/100$ for this example. Consequently, fractional-N synthesizers typically employ delta-sigma (Δ-Σ) modulators to vary the modulus in a random fashion and to shape it to resultant quantization noise to fall outside of the passband of the PLL. For certain applications, however, the channel resolution is not significantly tight to warrant a full-blown Δ-Σ synthesizer, although it is still desirable to realize fractional division ratios.

Another technique for implementing a fractional-N synthesizer, is based on a phase-switched frequency divider architecture, where different divide factors of a multi-modulus prescaler are realized using a phase rotator or phase selector to switch between different phase states of a plurality of phase shifted signals generated by the frequency divider, e.g., 4 signals having the same frequency but phases shifted by 0, $\pi/2$, $\pi$ and $3/2 \cdot \pi$ radians. For instance, in most implementations, switching is performed by transitioning from one phase state to a next phase state with is $\pi/2$ radians lagging in phase (e.g., from I to Q, from I+Q to Q−I, etc.), resulting in a scaling of the period by 1.25. Division by one value can be achieved by selecting one of four phase states while division by another value can be achieved by continuously rotating among the phase states at every cycle.

SUMMARY

In accordance with an aspect of the presently disclosed subject matter, there is provided an electronic sub-integer frequency divider circuit, including: (a) a phase rotator circuit configured to rotatably output, at a rate determined by a rate of pulses in a regulating signal, one or more of a plurality of phase-shift states having a frequency $f_A$, thereby producing a first signal whose frequency is determined by the frequency $f_A$ and by the regulating signal; (b) a clock circuitry configured to process the first signal to produce a first clock signal and a second clock signal which is different from the first clock signal; (c) a pulse generator configured to: (i) receive a plurality of M signals having a period TP and of different phases; wherein the period TP is longer than the periods of the first and the second clock signals; (ii) based on a control command, to process the second clock signal and one or more of the M signals, to produce a second signal which includes S pulses in each period TP; and (iii) process the second signal and the first clock signal to produce the regulating signal so that it includes Q pulses in each period TP, wherein Q is different from S; and (iv) an output interface configured to provide a sub-integer output signal whose frequency is responsive to the regulating signal.

In accordance with an embodiment of the presently disclosed subject matter, there is further provided an electronic sub-integer frequency divider circuit, including a phase rotator controller configured to generate, based on the rate of pulses in the regulating signal, control signals for the phase rotator circuit; wherein the phase rotator circuit is configured to rotatably output the one or more phase-shift states at a rate determined by the control signals, thereby producing a first signal whose frequency is determined by the frequency $f_A$ and by the control signals.

In accordance with an embodiment of the presently disclosed subject matter, there is yet further provided an electronic sub-integer frequency divider circuit, wherein the clock circuitry is configured to process the first clock signal to produce the second clock signal.

In accordance with an embodiment of the presently disclosed subject matter, there is yet further provided an electronic sub-integer frequency divider circuit, wherein the pulse generator is configured to produce the regulating signal based on the control command, so that the regulating signal includes Q pulses in each period TP if the control command fulfils a first criterion, and S pulses in each period TP otherwise.

In accordance with an embodiment of the presently disclosed subject matter, there is yet further provided an electronic sub-integer frequency divider circuit, wherein the pulse generator is configured to produce the regulating signal by processing the second signal and another signal to provide the regulating signal so that Q=S+G, wherein G is a preconfigured fixed number.

In accordance with an embodiment of the presently disclosed subject matter, there is yet further provided an electronic sub-integer frequency divider circuit, further including:

a prescalar circuit having a dividing factor A, being configured to receive an input signal of the electronic sub-integer frequency divider circuit and to process it to produce the plurality of phase-shifted signals from which the phase-shifted states are generated;

an integer divider having a dividing factor B, being configured to process the first signal to produced the first clock signal;

an integer divider having a dividing factor C, being configured to process the first clock signal to produce the second clock signal; and an integer divider having a dividing factor P, being configured to process the second clock signal to produce the plurality of M signals;

wherein the electronic sub-integer frequency divider circuit has a sub-integer-dividing factor equal to $A \cdot (BCP + (\Delta\phi/2\pi) \cdot (S+b^*G))$, where $\Delta\phi$ denotes a minimum phase shift possible from the phase rotator and where b is equal to 0 if the second signal is used as the regulating signal or 1 if the other signal is used in the producing of the regulating signal, and wherein A, B, C and P are integer values ≥1.

In accordance with an embodiment of the presently disclosed subject matter, there is yet further provided an electronic sub-integer frequency divider circuit, wherein the pulse generator is configured to process at least the first clock signal to produce a third signal which includes a preconfigured fixed number Y of pulses; wherein the pulse generator includes a multiplexer MX2 that is configured to alternate between the second signal and the third signal to produce the regulating signal.

In accordance with an embodiment of the presently disclosed subject matter, there is yet further provided an electronic sub-integer frequency divider circuit, wherein the second clock signal clocks the multiplexer MX2.

In accordance with an embodiment of the presently disclosed subject matter, there is yet further provided an electronic sub-integer frequency divider circuit, wherein the second clock signal is produced from the first clock signal by an integer frequency divider.

In accordance with an embodiment of the presently disclosed subject matter, there is yet further provided an electronic sub-integer frequency divider circuit, wherein the first clock signal and the second clock signal are non-overlapping signals having the same period.

In accordance with an embodiment of the presently disclosed subject matter, there is yet further provided an electronic sub-integer frequency divider circuit, wherein the plurality of M signals are produced from the second clock signal by an integer divider that is connected to the clock circuitry and to the pulse generator.

In accordance with an embodiment of the presently disclosed subject matter, there is yet further provided an electronic sub-integer frequency divider circuit, wherein the pulse generator is configured to select a subgroup including up to two signals out of the M signals based on the control command; to process the signals of the subgroup by at least one logic gate to produce a signal with a period TP whose duty cycle corresponds to the control command, and to input this signal with the second clock signal to an AND logical gate which produces the second signal.

In accordance with an embodiment of the presently disclosed subject matter, there is yet further provided an electronic sub-integer frequency divider circuit, including a first-level circuitry which includes a plurality of logical gates and a multiplexer MX1 which is clocked by the second clock signal; wherein the first-level circuitry is configured to receive as input one or more of the M signals and to selectively output, based on the control command, each out of a plurality of L possible periodic pulses of different duty cycles and with a period TP.

In accordance with an embodiment of the presently disclosed subject matter, there is yet further provided an electronic sub-integer frequency divider circuit, wherein for two of more of the plurality of L possible periodic pulses the multiplexer MX1 is configured to output one of the periodic pulse by selecting, in response to the control command, a signal provided to the multiplexer MX1 by one of the plurality of the logical gates which processes two of the M signals to produce the periodic pulse.

In accordance with an embodiment of the presently disclosed subject matter, there is yet further provided an electronic sub-integer frequency divider circuit, wherein:

the electronic sub-integer frequency divider circuit is part of an integrated circuit which further includes an additional unit to which the output signal of the electronic sub-integer frequency divider circuit is provided and which can operate in multiple frequencies;

wherein the electronic sub-integer frequency divider circuit includes a prescaler circuit having a dividing factor A, which is configured to receive an input signal of the electronic sub-integer frequency divider circuit and to process it to produce the plurality of phase-shifted signals which include differential I (in-phase) and Q (quadrature-phase) phase signals, and which is electrically connected to the phase rotator circuit for providing the phase-shifted signals to the phase-rotator circuit;

wherein the phase rotator circuit is further configured to phase interpolate between the plurality of phase-shifted signals output from the prescaler circuit to generate the plurality of phase-shift states having a minimum phase-shift resolution of $\Delta\phi$, and is electrically connected to a post-scaler integer divider having a dividing factor B which is configured to process the first signal to produce the first clock signal;

wherein the post-scalar integer divider is electrically connected to a conversion circuit which converts the first clock signal to match to requirements of CMOS logic, and which is electrically connected to the pulse generator for providing the first clock signal to the pulse generator, and to a first CMOS integer divider having a dividing factor C, which is configured to process the converted first clock signal to produce the second clock signal;

wherein the first CMOS integer divider is electrically connected to the pulse generator for providing the second clock signal to the pulse generator, and to a second CMOS integer divider having a dividing factor P;

wherein the second CMOS integer divider is configured to process the second clock signal to produce the plurality of M signals and to provide one of the M signals as the output signal of the electronic sub-integer frequency divider circuit; wherein the second CMOS integer divider is electrically connected to the pulse generator for providing the plurality of M signals to the pulse generator;

wherein the pulse generator is electrically connected to a phase rotator controller which is configured to generate, based on the rate of pulses in the regulating signal, control signals for the phase rotator circuit; wherein the phase rotator circuit is configured to rotatably output the one or more phase-shift states at a rate determined by the control signals, thereby producing a first signal whose frequency is determined by the frequency $f_A$ and by the control signals;

wherein the phase rotator controller is electrically connected to the phase rotator controller via a second conversion circuit which converts the control signals to match to electrical requirements of the phase-rotator circuit.

In accordance with an aspect of the presently disclosed subject matter, there is yet further provided a phase-locked loop frequency synthesizer, including: a phase detector; a low pass filter connected to the output of the phase detector; a voltage controlled oscillator (VCO) connected to the output of the low-pass filter; a fractional frequency divider circuit connected in a feedback loop between an output of the VCO and an input to the phase detector, wherein the fractional frequency divider circuit includes: (i) a phase rotator circuit configured to rotatably output, at a rate determined by a rate of pulses in a regulating signal, one or more of a plurality of phase-shift states having a frequency $f_A$, thereby producing a first signal whose frequency is determined by the frequency $f_A$ and by the regulating signal; (ii) a clock circuitry configured to process the first signal to produce a first clock signal and a second clock signal which is different from the first clock signal; (iii) a pulse generator configured to: (a) receive a plurality of M signals having a period TP and of different phases; wherein the period TP is longer than the periods of the first and the second clock signals; (b) based on a control command, to process the second clock signal and one or more of the M signals, to produce a second signal which includes S pulses in each period TP; and (c) process the second signal and the first clock signal to produce the regulating signal so that it includes Q pulses in each period TP, wherein Q is different from S; and (iv) an output interface configured to provide a sub-integer output signal whose frequency is responsive to the regulating signal.

In accordance with an aspect of the presently disclosed subject matter, there is yet further provided a method for sub-integer frequency division in electronic circuits, the method including: (a) processing a first signal that is outputted by a phase-rotator circuit to produce a first clock signal and a second clock signal which is different from the first clock signal; (b) based on a control command, processing the second clock signal and at least one signal having a period TP, thereby producing a second signal which includes S pulses in each period TP; wherein the period TP is longer than the periods of the first and the second clock signals; (c) processing the second signal to produce a regulating signal, wherein, if a first criterion is fulfilled, the producing of the regulating signal includes producing the regulating signal by processing the second signal and the first clock signal, so that the regulating signal includes Q pulses in each period TP, wherein Q is different from S; (d) producing the first signal by rotatably outputting from the phase rotator circuit at a rate determined by the regulating signal one or more of a plurality of phase-shift states having a frequency $f_A$, so that a frequency of the first signal is determined by the frequency $f_A$ and by the regulating signal; and (e) providing a sub-integer output signal whose frequency is responsive to the regulating signal.

In accordance with an embodiment of the presently disclosed subject matter, there is yet further provided a method, including processing the first clock signal to produce the second clock signal.

In accordance with an embodiment of the presently disclosed subject matter, there is yet further provided a method, wherein the first criterion pertains to content of the control command, wherein the method includes producing the regulating signal based on the control command so that the regulating signal includes Q pulses in each period TP if the control command fulfils the first criterion, and otherwise S pulses in each period TP.

In accordance with an embodiment of the presently disclosed subject matter, there is yet further provided a method 7, including producing the regulating signal by processing the second signal and another signal to provide the regulating signal so that Q=S+G, wherein G is a preconfigured fixed number.

In accordance with an embodiment of the presently disclosed subject matter, there is yet further provided a method including processing at least the first clock signal to produce a third signal which includes a preconfigured fixed number Y of pulses; and alternating between the second signal and the third signal to produce the regulating signal.

In accordance with an embodiment of the presently disclosed subject matter, there is yet further provided a method wherein the alternating is clocked by the second clock signal.

In accordance with an embodiment of the presently disclosed subject matter, there is yet further provided a method, including producing the second clock signal from the first clock signal by an integer frequency divider.

In accordance with an embodiment of the presently disclosed subject matter, there is yet further provided a the first clock signal and the second clock signal are non-overlapping signals having the same period.

In accordance with an embodiment of the presently disclosed subject matter, there is yet further provided a method, including producing the plurality of M signals from the second clock signal by an integer divider.

In accordance with an embodiment of the presently disclosed subject matter, there is yet further provided a method including: (a) selecting a subgroup including up to two signals out of the M signals based on the control command; (b) processing the signals of the subgroup by at least one logic gate to produce a signal with a period TP whose duty cycle corresponds to the control command, and (c) inputting this signal with the second clock signal to an AND logical gate which produces the second signal.

In accordance with an embodiment of the presently disclosed subject matter, there is yet further provided a method inputting one or more of the M signals to a first-level circuitry which includes (a) a plurality of logical gates and (b) a multiplexer MX1 which is clocked by the second clock signal; and wherein the first-level circuitry is configured to selectively output, based on the control command, each out of a plurality of L possible periodic pulses of different duty cycles and with a period TP.

In accordance with an embodiment of the presently disclosed subject matter, there is yet further provided a method including generating, based on the rate of pulses in the regulating signal, control signals for the phase rotator circuit; wherein the producing of the first signal includes producing the first signal by rotatably outputting the one or more phase-shift states from the phase rotator circuit in a rate determined by the control signals, thereby producing a first signal whose frequency is determined by the frequency $f_A$ and by the control signals.

In accordance with an aspect of the presently disclosed subject matter, there is yet further provided a pulse generator, including: (i) a first-level circuitry which includes a plurality of logical gates and a multiplexer which is clocked by a second clock signal; the first-level circuitry being configured to (a) receive as input one or more of a plurality of M signals having a period TP and of different phases which are provided to the pulse generator, and (b) to selectively output, based on a control command, each out of a plurality of L possible periodic pulses of different duty cycles and with a period TP; (ii) a second-level circuitry being configured to process one or more of the L periodic pulses and the second clock signal, to produce a second signal which includes S pulses in each period TP; (iii) a third-level circuitry being configured to process the second signal and a first clock signal to produce a regulating signal so that it includes Q pulses in each period TP, wherein Q is different from S; and (iv) an electrical connection for transmitting the regulating signal from the third-level circuitry toward a phase-rotator of an electronic sub-integer frequency divider circuit in which the pulse generator is included, thereby causing the electronic sub-integer frequency divider circuit to operate in a sub-integer division ratio mode; wherein the first clock signal and the second clock signal which is different from the first clock signal are produced by a processing of a first signal whose frequency is determined by a rate of pulses in the regulating signal and which is outputted by the phase-rotator circuit which rotatably outputs, at a rate determined by the rate of pulses in a regulating signal, one or more of a plurality of phase-shift states having a frequency $f_A$; wherein the period TP is longer than the periods of the first and the second clock signals.

BRIEF DESCRIPTION OF THE DRAWINGS

In order to understand the invention and to see how it may be carried out in practice, embodiments will now be described, by way of non-limiting example only, with reference to the accompanying drawings, in which:

FIGS. 4B through 4E illustrates additional optional stages of the method of FIG. 4A;

Figure 1:
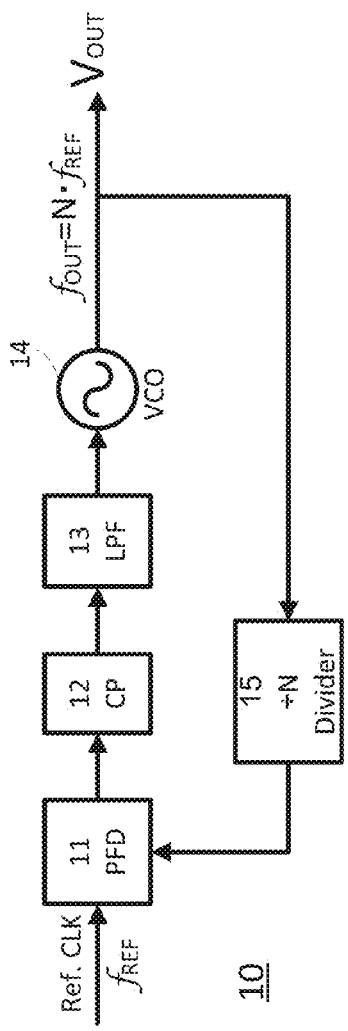
FIG. 1 is a block diagram illustrating a conventional phase-lock-loop frequency synthesizer.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF EMBODIMENTS

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

In the drawings and descriptions set forth, identical reference numerals indicate those components that are common to different embodiments or configurations.

Unless specifically stated otherwise, as apparent from the following discussions, it is appreciated that throughout the specification discussions utilizing terms such as "processing", "calculating", "computing", "determining", "generating", "setting", "configuring", "selecting", "defining", or the like, include action and/or processes of a computer that manipulate and/or transform data into other data, said data represented as physical quantities, e.g. such as electronic quantities, and/or said data representing the physical objects.

As used herein, the phrase "for example," "such as", "for instance" and variants thereof describe non-limiting embodiments of the presently disclosed subject matter. Reference in the specification to "one case", "some cases", "other cases" or variants thereof means that a particular feature, structure or characteristic described in connection with the embodiment(s) is included in at least one embodiment of the presently disclosed subject matter. Thus the appearance of the phrase "one case", "some cases", "other cases" or variants thereof does not necessarily refer to the same embodiment(s).

It is appreciated that certain features of the presently disclosed subject matter, which are, for clarity, described in the context of separate embodiments, may also be provided in combination in a single embodiment. Conversely, various features of the presently disclosed subject matter, which are, for brevity, described in the context of a single embodiment, may also be provided separately or in any suitable sub-combination.

In embodiments of the presently disclosed subject matter one or more stages illustrated in the figures may be executed in a different order and/or one or more groups of stages may be executed simultaneously and vice versa. The figures illustrate a general schematic of the system architecture in accordance with an embodiment of the presently disclosed subject matter. Each module in the figures can be made up of any combination of software, hardware and/or firmware that performs the functions as defined and explained herein. The modules in the figures may be centralized in one location or dispersed over more than one location.

Figure 2:
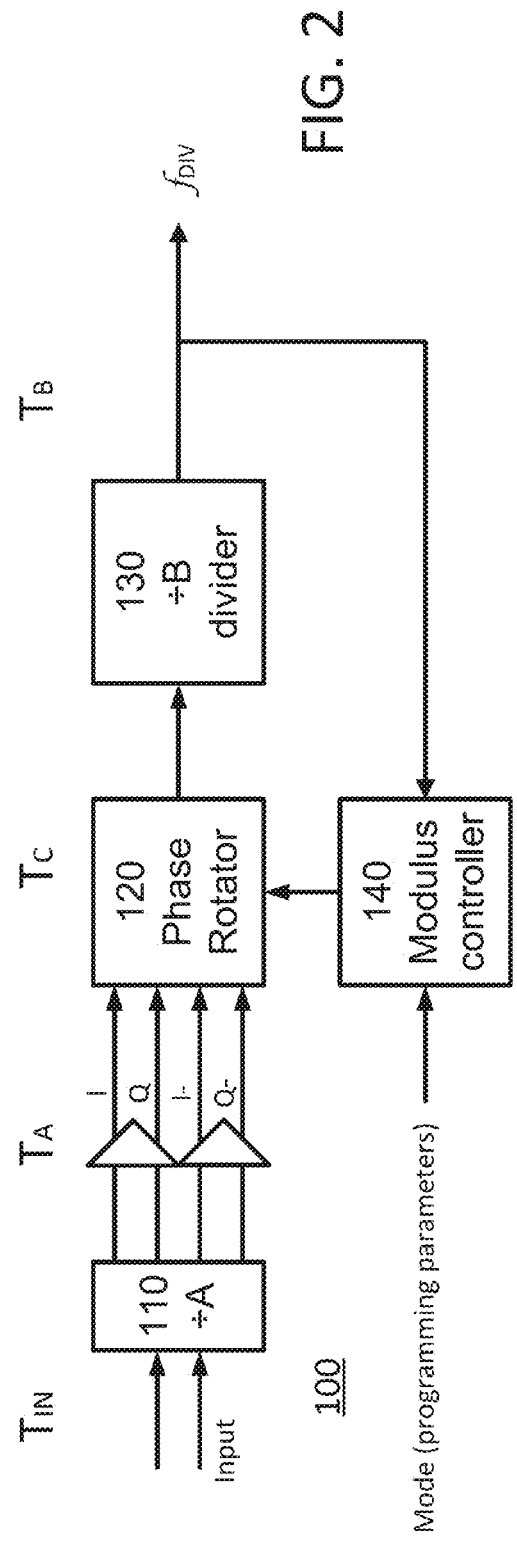
FIG. 2 is a schematic circuit diagram of a programmable sub-integer N frequency divider circuit according to an exemplary embodiment of the invention.

FIG. 2 is a schematic circuit diagram of a programmable sub-integer N frequency divider circuit 100. In particular, FIG. 2 schematically illustrates an exemplary framework of a phases switched, rotator-based frequency divider circuit 100 that is designed to generate output signal frequencies having arbitrary fractional (sub-integer) division ratios of an input signal frequency. Sub-integer refers to division ratios of, e.g., X.5, X.25, X.1, etc., where H is an integer.

In general, frequency divider 100 includes a divider 110 (also referred to as prescaler 110) with a dividing factor (or divisor) A, a phase selector/rotator circuit 120, a divider 130 (also referred to as post-scaler circuit 130) with a dividing factor B, and a modulus controller 140. It is noted that in the context of this disclosure, the terms prescalar and prescaler are used interchangeably, and likewise the terms post-scalar and post-scaler.

The divider 110 receives an input signal $T_{IN}$ and divides the input signal $T_{IN}$ by A, to provide a signal $T_A$, where A can be any value (e.g. 2, 4, etc.). The signal $T_A$ of the divider 110 includes differential quadrature signals, including differential in-phase signals (I) and (I−) and differential quadrature-phase signals (Q) and (Q−), which are input to the phase rotator 120. The quadrature signals I, Q, I− and Q− are sinusoidal signals of the same frequency but having phases shifted by 0, $\pi/2$, $\pi$ and $3/2 \cdot \pi$ radians, respectively.

The four phases are input to the phase rotator 120. The phase rotator 120 incrementally applies a positive or negative phase shift to the signal $T_A$ in response to control signals output from the modulus controller 140 by rotating to different phase states. In one exemplary embodiment of the invention, the phase rotator 120 is designed to perform phase interpolation to generate the desired output phases by interpolating between the differential I and Q input phases.

In particular, as will be explained in further detail below, the phase rotator 120 may be constructed with a circuit topology that performs phase shifting by linearly combining I and Q signals in appropriate ratios in the current or voltage domain so as to achieve a desired phase shift resolution. For example, the phase rotator 120 can interpolate between the I and Q input phases to generate 4 different output phases such as I+Q, I−Q, −I−Q and −I+Q, thereby providing a phase shift resolution of $\pi/2$.

The output of the phase rotator 120 is applied to divider 130 which has a dividing factor B. The output of the divider 130 is used as a clock for the modulus controller 140, thereby defining a control cycle for the phase rotator 120. The phase rotator 120 performs a phase rotation once every B period of the phase rotator 120. The output of the frequency divider 100, $f_{Div}$, can be taken directly from the output of the post-scaler 130 or from some internal node in the modulus controller 140, depending on the framework of the modulus controller 140.

The phase rotator 120 applies a neutral, a negative or a positive phase, $k \cdot \Delta\phi$, to the signal $T_A$ once every control cycle, where Δϕ denotes a minimum phase shift possible from the phase rotator 120 and where k is an integer. With the divider 110 at the input of the phase rotator 120, the equivalent phase shift is Ak·Δϕ with respect to the input signal $T_{IN}$. The mantissa of the fractional divider 100 circuit in the illustrated example is equal to Ak·Δϕ/2π. The overall dividing factor of the divider circuit 100 at the output of the modulus controller 140 may be represented as N(k)=(AB+Ak·Δϕ/2π), where AB denotes an integer portion of the divisor and where Ak·Δϕ/2π denotes the fractional portion or mantissa of the divisor.

It should be noted that the phase rotator 120 can rotate in either angular direction. In one direction (referred to as "clockwise"), where the value of k is positive, the phase is rotated to counteract the counter-clockwise angular frequency of the input signal $T_A$, and thereby decrease the frequency of the signal (i.e., increase its output period). In the other direction (referred to as "counter-clockwise"), where the value of k is negative, the phase can be rotated to enhance the counter-clockwise angular frequency of the input signal, and thereby increase the frequency of the signal (i.e., decrease its output period). Since the phase rotator 120 can phase rotate the signal $T_A$ in either angular direction, the period $T_R$ of the signal outputted from the phase rotator 120 can be either less than or greater than the period $T_A$ of the input signal to the phase rotator 120.

Figure 3:
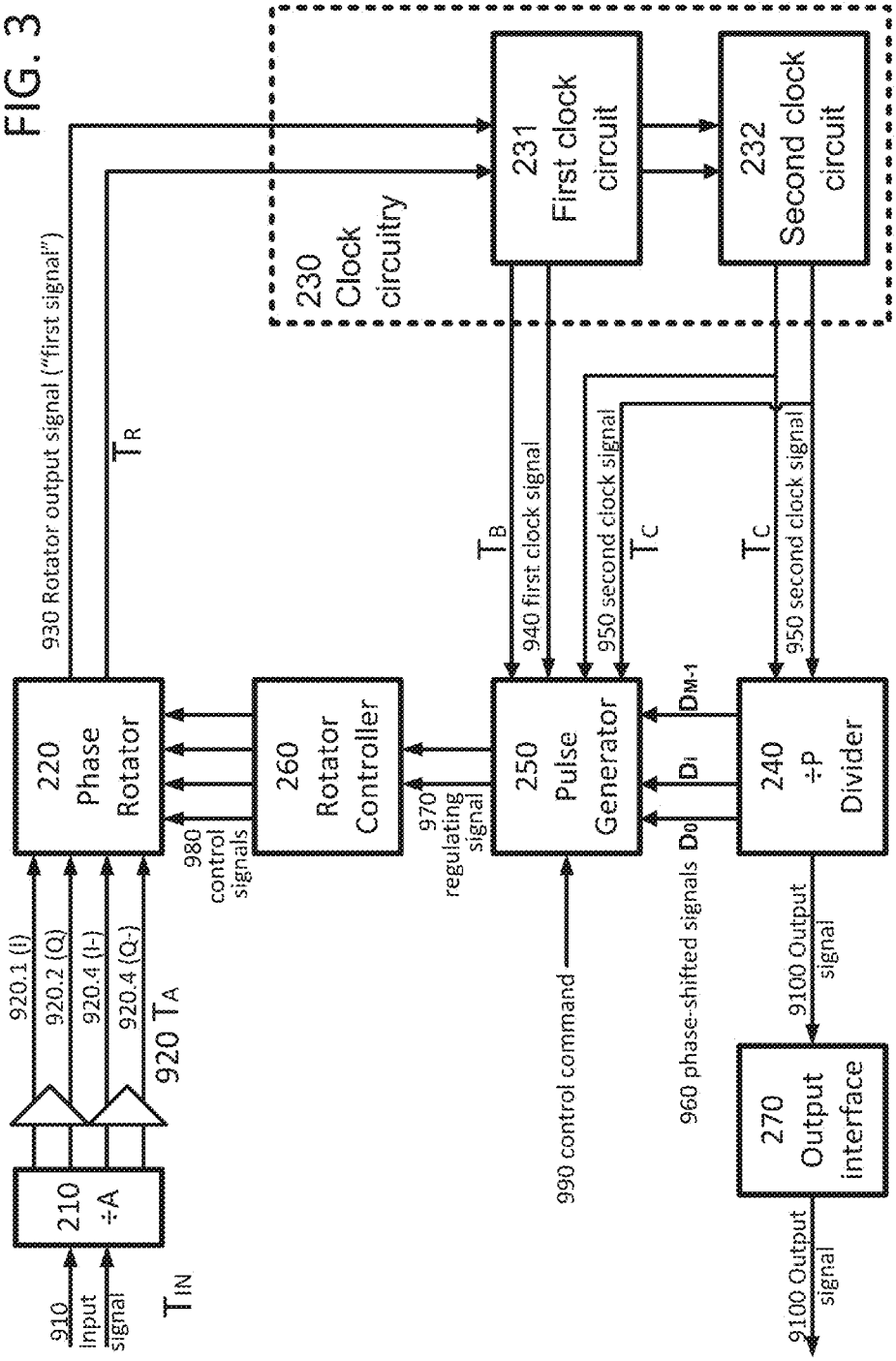
FIG. 3 is a block diagram of an electric sub-integer frequency divider circuit, according to an embodiment of the invention.

FIG. 3 is a block diagram of an electric sub-integer frequency divider circuit 200, according to an embodiment of the invention. It should be noted that the names used for the different signals in divider circuit 200 (e.g. regulating signal, second signal, rotator output signal, etc.) are used as a matter of convenience only in order to make the referencing to each of these signals easier. These names therefore should not be interpreted to limit the electrical characteristic, the functionality, or the use by which such signals may be characterized when implementing the invention.

It should be noted that in the description below, signals are described to be produced by processing of other signals (e.g. "unit AA processes signal BB to produce signal CC"). It is noted that the terms processing and producing as used below do not mean (unless stated to the contrary) that the output signal is produced by processing only of the first signal. Thus, in the above example unit AA my produce signal CC by processing only signal BB, or by processing it together with signal DD (e.g. by inputting both signals BB and DD to a logical gate such as an AND gate, by multiplexing signals BB and DD, by multiplexing signal BB and a null signal when signal DD acts as clock for the multiplexer, and so on).

Divider circuit 200 includes phase rotator circuit 220 (also referred to as "phase rotator 220") that is configured to rotatably output, at a rate determined by a rate of pulses in regulating signal 970, one or more of a plurality of phase-shift states of similar frequency (referred to as "frequency $f_A$", as a matter of convenience). By rotating between the phase-shift states, phase rotator 220 produces signal 930 (also referred to as "first signal 930" and "rotator output signal 930").

Divider circuit 200 may also include a prescaler circuit 210 that is configured to divide a frequency of an input signal by an integer factor A and to output a plurality of phase-shifted signals each having a frequency of 1/A. The amount of phase-shifted signals outputted by prescaler 210 may vary in different implementations. For example, divider 210 may output four phase-shifted signals which include differential I (in-phase) and Q (quadrature-phase) phase signals. In the illustrated example, divider 210 outputs two differential in-phase signal, I and I–, and two quadrature-phase signals, Q and Q–.

Phase-rotator 220 may receive as input a plurality of phase-shifted signals (e.g. a plurality of quadrature signals I, Q, I– and Q– which are sinusoidal signals of the same frequency but having phases shifted by 0, π/2, π and 3/2·π radians, respectively). Optionally, phase-rotator 220 may receive as input more or less than 4 incoming signals which differ in their phases). Phase rotator 220 may be configured (e.g. by including a dedicated circuit topology) to perform phase shifting by linearly combining I and Q signals in appropriate ratios in the current or voltage domain so as to achieve a desired phase shift resolution. For example, the phase rotator 220 can be configured to interpolate between the I and Q input phases to generate 4 different output phases such as I+Q, I–Q, –I–Q and –I+Q, thereby providing a phase shift resolution of π/2. More or less than 4 phase shift states (e.g. 8 states) may also be used.

Optionally, phase rotator 220 may be implemented with an architecture that is capable of generating a plurality of phases (phase-shift states, e.g. 4 such states) by interpolating between differential I and Q phases at the input to the phase rotator 220, whereby the differential I and Q input signals are linearly combined (summed) in the current or voltage domain with appropriate weights to achieve a desired phase shift. The minimum phase-shift resolution of the phase-shift states interpolated by phase-rotator 220 is denoted Δϕ(e.g. Δϕ=π/2 in the above four states example). The phase-shift resolution of phase-rotator 220 in such cases determines the resolution of the division ratios that divider circuit 200 may produce.

For example, phase-rotator 220 may include an I-channel transconductance amplifier and respective multiplier, a Q-channel transconductance amplifier and a respective multiplier, and a summing circuit for these two channels. In such cases, phase rotator 220 may perform phase interpolation of the differential I and Q phase input signals based on respective control inputs ($\alpha_I$ and $\alpha_Q$), which provide sign (+, –) control and which specify interpolation weighting factors α (e.g. gain), and then summing the differential I and Q input signals in the current or voltage domain with the appropriate weights to achieve a desired phase shift. The differential I and Q input signals are linearly combined (summed) in the current or voltage domain with appropriate weights to achieve a desired phase shift. The output of phase rotator 220 in such case is generated by linearly combining the I and Q channel output currents via the summing circuit to output an interpolated output current signal Out=$\alpha_I g(v_I)+\alpha_Q g(v_Q)=[\alpha_I+j\alpha_Q]g(v_I)$.

As aforementioned, more than 4 phase-shift states may be generated for a smaller number of phase-shift signal inputs. A desired phase interpolation granularity (phase shift resolution) may be obtained based on the number of control bits in the control inputs and based on the phase rotator circuit topology implemented to achieve a desired phase-shift resolution. In some variations, phase-rotator 220 may also receive the interpolated phase-shifts states from an external source, or use the input phase-shift signals as phase-shift states.

The frequency of signal 930 is determined by the aforementioned frequency $f_A$, and by the control signals 980. The control signals affect the ratio between the frequency $f_A$ and the frequency of signal 930 by determining the rate at which phase-rotator 220 rotates between the phase-shift states. It is noted that while not necessarily so, phase-rotator 220 may be implemented to incorporate any combination of the functionalities discussed with respect to phase-rotator 120.

At a rate determined by control signals 980 provided by phase-rotator controller circuit 260, one or more of a plurality of phase-shift states of similar frequency (referred to as "frequency $f_A$", as a matter of convenience) are generated. By rotating between the phase-shift states, phase rotator 220 produces signal 930 (also referred to as "first signal 930" and "rotator output signal 930"). The frequency of signal 930 is determined by the aforementioned frequency $f_A$, and by the control signals 980. The control signals affect the ratio between the frequency $f_A$ and the frequency of signal 930 by determining the rate at which phase-rotator 220 rotates between the phase-shift states. It is noted that while not necessarily so, phase-rotator 220 may be implemented to incorporate any combination of the functionalities discussed with respect to phase-rotator 120.

Divider circuit 200 may also include phase rotator controller 260 which is configured to generate control signals 980 for phase rotator circuit 220 based on a rate of pulses in regulating signal 970. That is, indirectly, the rate at which phase rotator 220 rotatably outputs the phase-shift states depends on the rate of pulses in the regulating signal 970 generated by pulse generator 250. The rate of the rotation between the phase-shift states may be equal to the rate of the pulses in regulated signal 970, or otherwise derived therefrom by the mediation of rotator controller 260. It is noted that while not necessarily so, rotator controller 260 may be implemented to incorporate any combination of the functionalities discussed with respect to modulus controller 140.

Divider circuit 200 further includes clock circuitry 230 that is configured to process the first signal 930 to produce at least two different clock signals: first clock signal 940 and a second clock signal 950. Optionally, clock circuitry 230 may be configured to produce the second clock signal 950 by processing the first clock signal 940. Alternatively, both may be generated from first signal 930.

Generally, when two arrows connect two modules in the illustration, the same signal may be provided over two connections, or the signal and its inverse signal may be provided over two such connections. However, even when two arrows are illustrated, the signal may also be provided in only one copy—without a duplicate or an inverse signal.

As will be discussed below, the second clock signal 950 may be slower than the first clock signal 940 (i.e. have lower frequency and longer period), and may be derived from the former by an integer divider. However, other variations may also be used (e.g. using two clocks of the same frequency but with different phases, etc.), as further mentioned in the discussion below. Also, first clock signal 940 may be slower than the input rotator output signal 930 provided by phase-rotator 220, and may be derived from the former by an integer divider.

Generally, clock circuitry may include two electric circuits—first clock circuit 231 which is configured to receive first signal 930, to process it and to provide first clock signal 940, and second clock circuit 232 which is configured to receive first clock signal 940, to process it and to provide second clock signal 950. Optionally, the second clock circuit 232 may receive rotator output signal 930 (or a signal derived from which) as an input, and process it for producing the second clock signal 950.

However, the first clock signal and the second clock signals should be synchronized which each other.

It is noted that while different kinds of periodic signals may be processed by divider circuit 200, and especially—that different kinds of periodic signals may serve as clock signals in divider circuit 200, a common kind of clock signals used in electronic circuits are electrical signals which oscillate between a high and a low state and may therefore be utilized to coordinate actions of circuits. The rise and fall times of the first and the second clock signals in divider circuit 200 may be synchronized which each other.

That is, $N_R$ out of each $M_R$ rises of the second clock signal must be synchronized (i.e., concurrent within very limited allowed timing-error window) with rises (or with falls) of the first clock signal, and $N_F$ out of each $M_F$ falls of the second clock signal must be synchronized (i.e., concurrent within very limited allowed timing-error window) with falls (or with rises) of the first clock signal. While not necessarily so, $M_R=M_F$ and $N_R=N_F$, and possibly $M_R=M_F=1$. The term "rise" refers to transition of the signal from low state to high state, and the term "fall" refers to transition of the signal from high state to low state.

Figure 6:
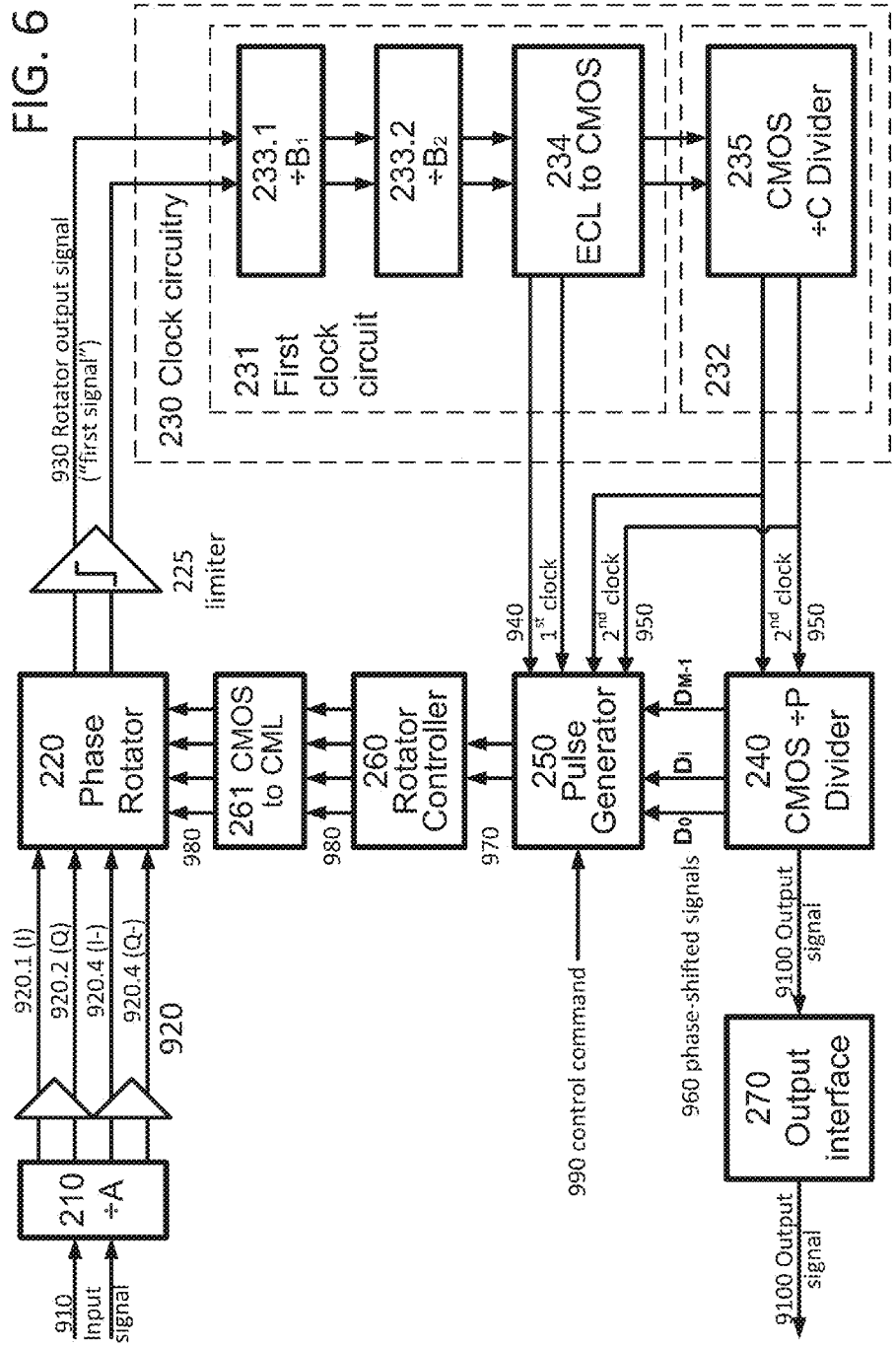
FIG. 6 is a block diagram of an electric sub-integer frequency divider circuit, according to an embodiment of the invention.

It is noted that such synchronization between the first clock signal 940 and the second clock signal 950 is achieved if the second clock signal 950 is obtained from the first clock signal 940 by an integer frequency divider (such as divider 235 illustrated in FIG. 6).

This two clock signals are used by pulse generator 250 of divider circuit 200, for generating the regulating signal which is used to pace the operation of phase-rotator 220.

Figure 5:
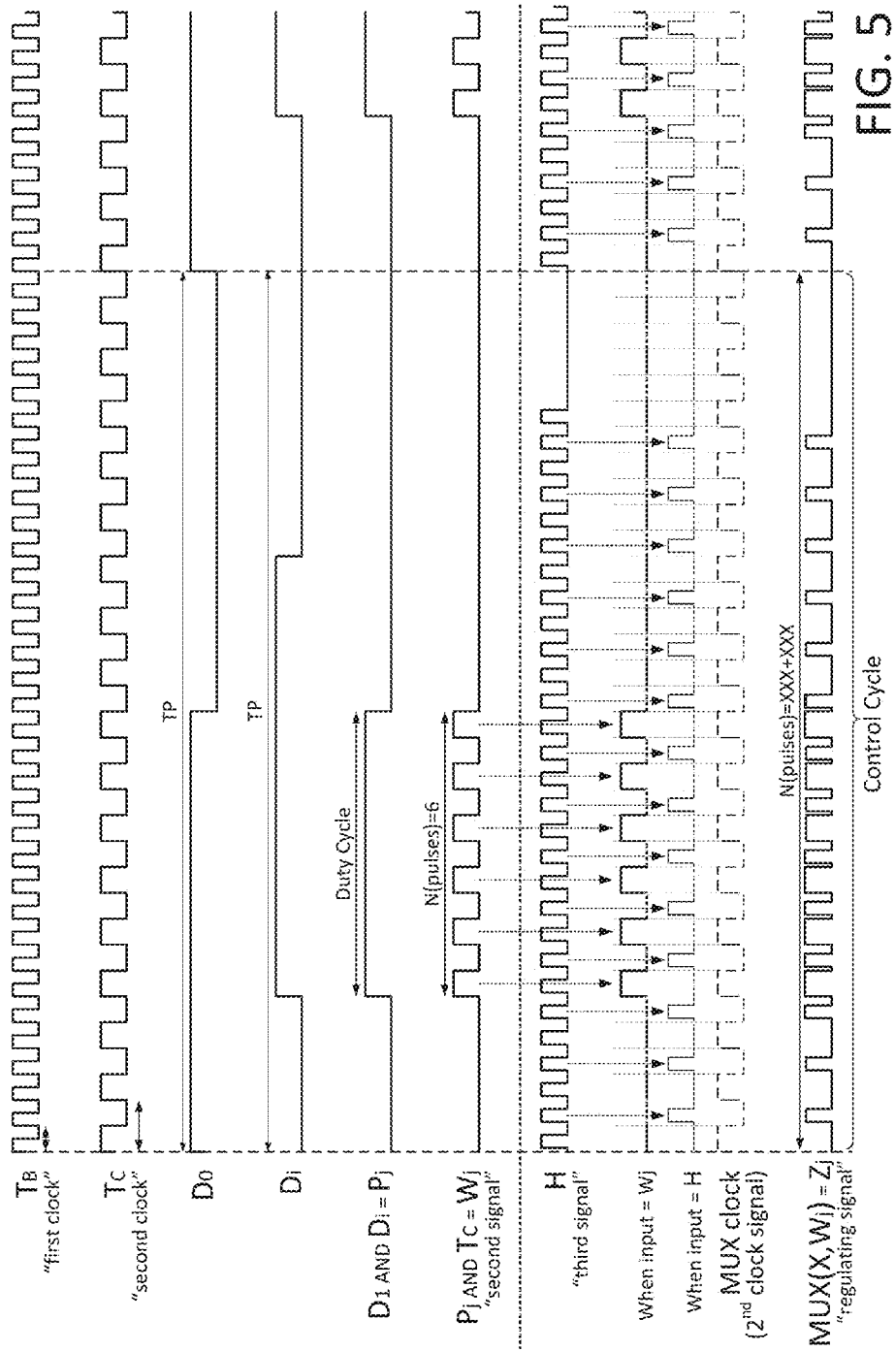
FIG. 5 illustrates several signals in an electric sub-integer frequency divider circuit, according to an embodiment of the invention.

In addition to the two clock signals, pulse generator 250 is also configured to receive a plurality of M signals 960 having the same period (denoted TP) and which are of different phases (such as signals $D_0$ and Di illustrated in FIG. 5). It is noted that the period TP of these M signals is longer than the periods of the first and the second clock signals. It is noted that the period TP of the M signals is the period of the control cycle of the phase rotator circuit 220.

The plurality of M signals may be produced by a component of divider circuit 200 from the first or the second clock signals. For example, the plurality of M signals may be produced from the second clock signal 950 by an integer divider 240 (whose dividing factor is denoted P) that is connected to the clock circuitry 230 and to the pulse generator 250.

For example, we can express each of the plurality of M signals, $D_n$, as $$D_n = P\left(\frac{2\pi \cdot f_{in}}{37}t + \frac{1}{f_{in}}n\right),$$

where P represents a rectangular wave with 50% duty-cycle, and $f_{in}$ is the frequency of the input clock (i.e. the second clock signal).

Pulse generator 250 is also configured to process the second clock signal 950 and one or more of the M signals 960, and by processing these signals to produce a second signal which includes S pulses in each period TP. This second signal is used internally in pulse generator 250, and is therefore not illustrated in FIG. 3. It is however illustrated in FIG. 5.

Pulse generator 250 produces this second signal based on a control command 990. The control command 990 may indicate a number of pulses to be included in the regulating signal 970 in each control cycle, but other kinds of control commands may be used (e.g. indicating an overall frequency dividing ratio of divider circuit 200). For simplicity of discussion, a possible implementation is one in which the control command 990 indicates the number of pulses to be included in the regulating signal 970 in each control cycle (this number is also denoted as NC below).

As discussed below in greater detail, the number of pulses in the second signal in each period TP is limited. For example, if the M signals 960 are generated by a divider whose dividing ratio is P, this maximal number of pulses may be a function of P. For example, processing the M signals with the second clock signal by standard logical gates (without any dedicated delaying or dividing mechanisms) would permit, at most, P pulses in each period TP. Using a faster clock (e.g. the first clock signal in relevant implementations) may enable generating more pulses in each period TP, but would require more complex circuitry (for the generating of the M signals and/or for their processing)

Also, the maximal number of pulses in the second signal in each period TP may be limited as a function of the different signals 960. Increasing the number of signals may enable increasing the maximal number of pulses in the second signal in each period TP, but would significantly increase the complexity of the circuit required to generate a wide selection of number S of pulses.

Pulse generator 250 is capable, however, of producing a regulating signal with more pulses S using a comparatively simpler circuit, as discussed below.

Generally, pulse generator 250 is configured to produce the regulating signal 970 by processing the second signal and the first clock signal 940, so that the regulating signal includes Q pulses in each period TP, wherein Q is different from S.

Optionally, pulse generator 250 may be configured to produce the regulating signal 970 in this way (i.e. by processing the second signal and the first clock signal 940) selectively, i.e., only if a certain decision rule is met.

One way of producing the producing the regulating signal 970 so that its number of pulses Q in each period TP is different than the number of pulses in the second signal (S) is by "injecting" a fixed number of external pulses to the second signal. Some possible ways for producing the regulating signal 970 so that its number of pulses Q in each period TP is different than the number of pulses in the second signal (S) are discussed below.

It is noted that if the requested number of pulses NP may be generated in the second signal in each period TP, then the second signal may be used as the output regulating signal 970 without further processing.

Producing a regulating signal 970 which includes a number of pulses Q per period TP which cannot be generated in the second signal means that divider circuit 200 as a whole may produce more division ratios than otherwise. In the cases discussed below, increasing the number of division ratios by manipulating the second signal requires less complex circuits, less power, and/or less volume on the chip when compared to the resources required in alternative implementations.

Figure 7:
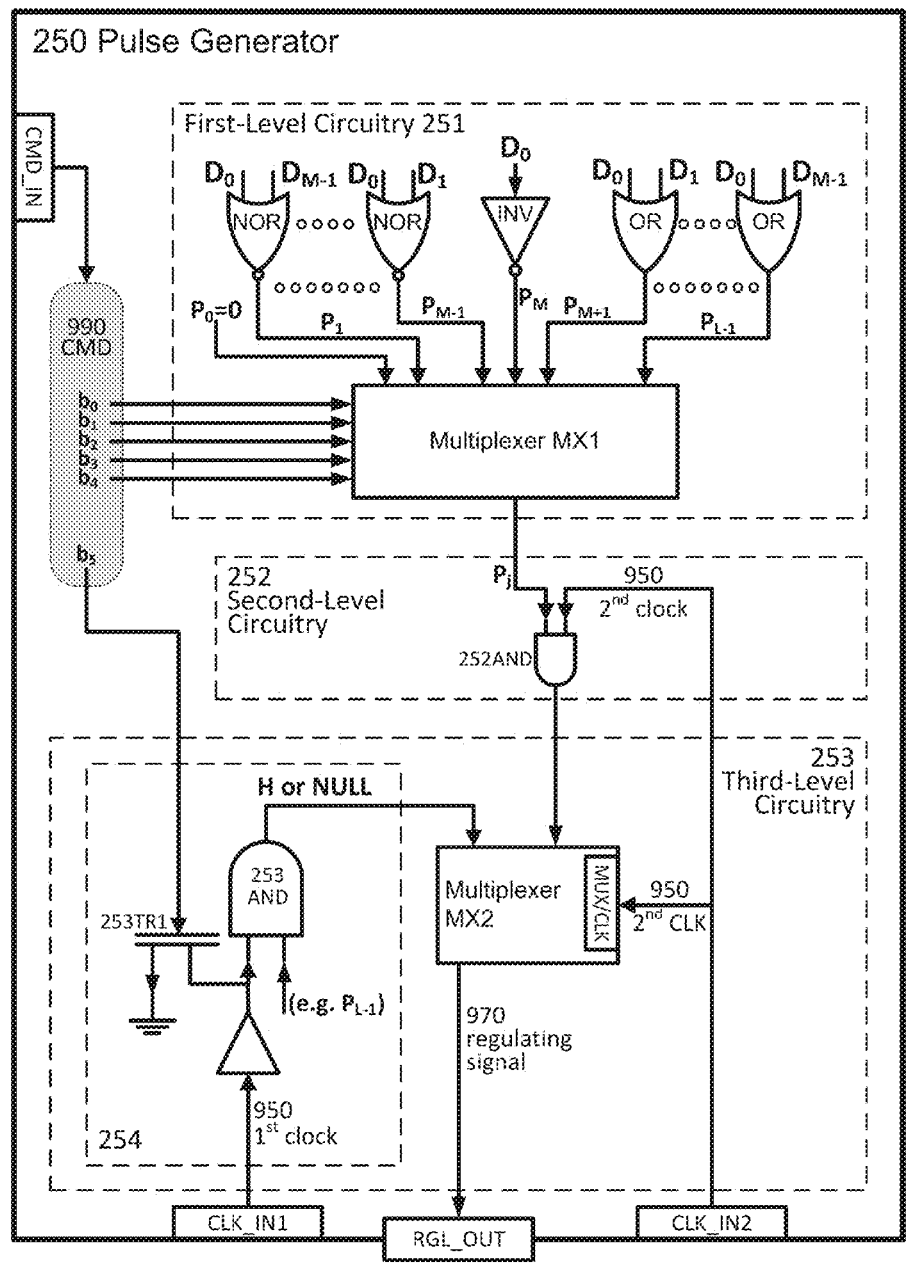
FIG. 7 illustrates a pulse generator, which may be a part of the electric sub-integer frequency divider circuit of FIG. 3, according to an embodiment of the invention.

While in the example of FIG. 7, the logical gates of the first-level circuitry enable production of second signals having any number of pulses between 0 and P (by previously allowing the production of periodic pulses $P_j$ (whose duty cycle is j/P), wherein j is any integer between 0 and P. The first-level circuitry, however, may include less logical gates and allow generation of less periodic pulses $P_j$. For example, assuming P=37, the first level circuitry may include a smaller number of logical gates, enabling creation of only 24 different periodic pulses $P_j$, which would allow the second-level circuitry to produce only 24 different types of second signals (differing by the number of pulses in each period TP).

The utilization of the first level circuitry, and of the first clock signal, enables creation of 48 different regulating signals, with significantly smaller circuitry (requiring, for example, a smaller number of logical gates).

Referring generally to divider circuit 200, and especially to pulse generator 250, it is noted that the output regulating signal 970 is generated in at least some of the cases using two different clock signals: the second signal is generated using the second clock signal 950 (and other signals), and the regulating signal 970 is produced using also the first clock signal 940—which is different than the second clock.

Divider circuit 200 also includes output interface 270 which is configured to provide (e.g. to an external entity which requires a clock in a relatively low frequency with respect to the input signal 910 and/or to frequency $f_A$) an output signal 9100 whose frequency is responsive to the regulating signal (which is, in turn, based on the control command). Especially, for at least some of the possible control commands which pulse generator 250 is configured to handle, output interface 270 is configured to provide a sub-integer output signal (whose frequency, as stated above, is responsive to the regulating signal).

The division ratio of divider circuit 200 is determined between a frequency of a signal inputted to divider circuit 200 (e.g. input signal 910). to the frequency of output signal 9100. Usually, the signal inputted to divider circuit 200 would be a clock signal whose frequency is higher than $f_A$ (e.g. by an integer division ratio).

As indicated above, sub-integer division ratios are partly fractional division ratios which include a whole part (an integer) and a proper functional part (e.g. ¼, ½ etc.). Such a sub-integer may be written as X.5, X.25, X.1, etc., where H is an integer, and as n/m wherein n>m and n and m are integers.

It is noted that optionally, for some of the possible control commands, output interface 270 may be configured to provide an output signal having an integer division ratio (and whose frequency, as stated above, is responsive to the regulating signal).

Figure 4A:
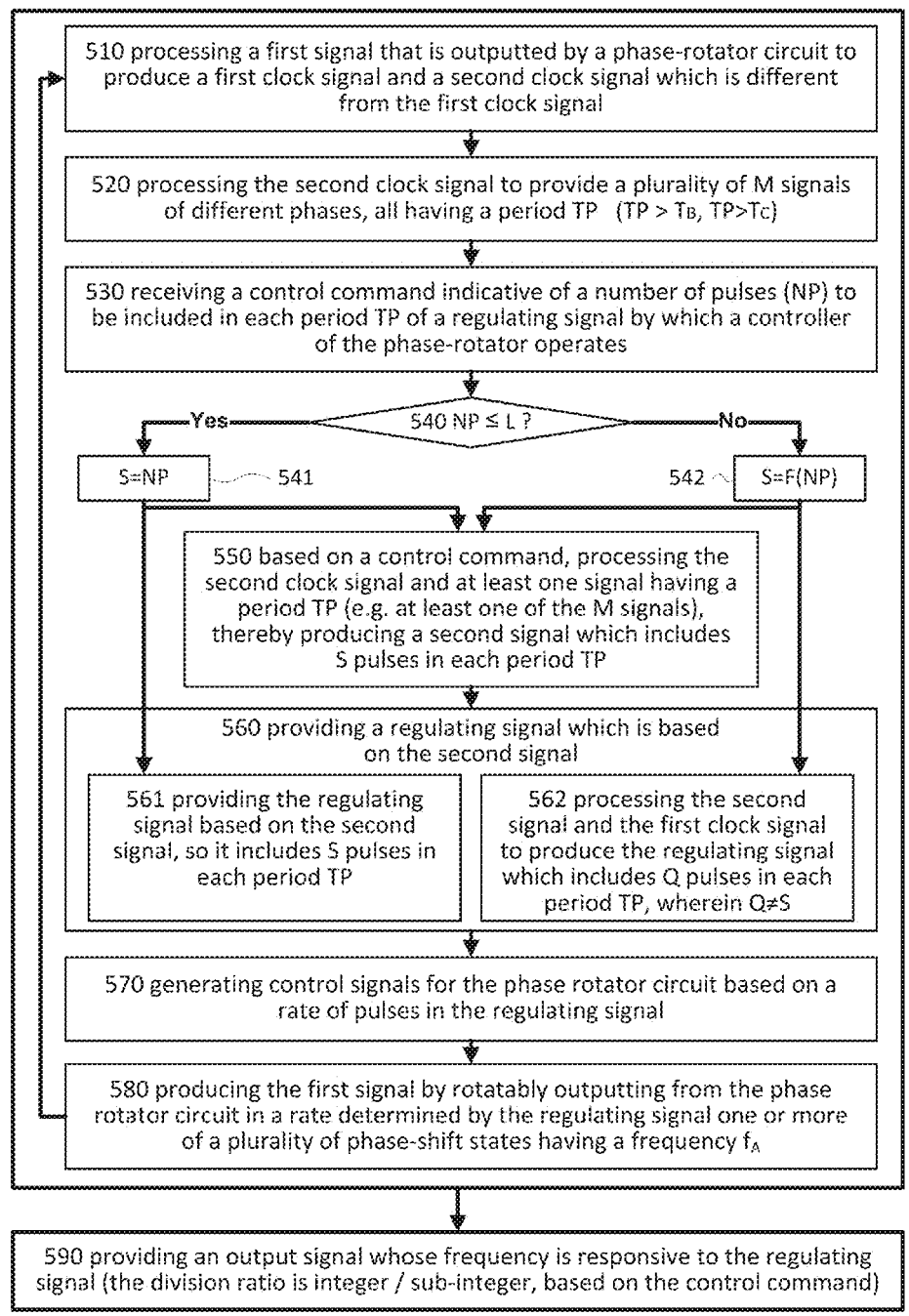
FIG. 4A is a flow chart of a method for sub-integer frequency division, according to an embodiment of the invention.
Figure 4E:
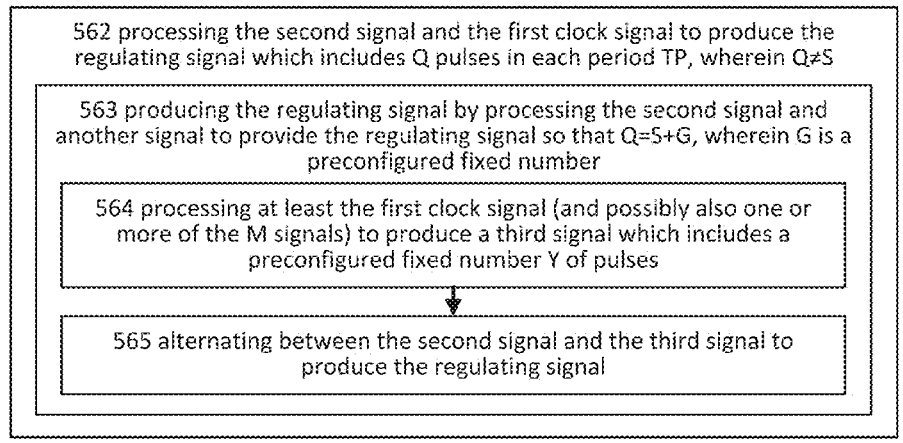

FIG. 4A is a flow chart of method 500, which is a method for sub-integer frequency division, according to an embodiment of the invention. FIGS. 4B through 4E illustrate additional optional stages of method 500 which were not illustrated in FIG. 4A. Referring to the examples set forth in the previous drawings, method 500 may be carried out by divider circuit 200. Different embodiments of divider circuit 200 may implement the various disclosed variations of method 500 even if not explicitly elaborated. Likewise, different embodiments of method 500 may include stages whose execution fulfills the various disclosed variations of divider circuit 200, even if succinctness and clarity of description did not necessitate such repetition.

As can be learnt from the discussion of divider circuit 200, the process is implemented in a cyclic manner, so that the output of the phase-rotator is processed in various manners, and thereafter used to control the phase-rotator. While method 500 is not necessarily limited to the configuration of divider circuit 200, it is nevertheless also cyclic. The following description starts after the output of the phase-rotator is generated, and then describes how this generation is controlled.

Stage 510 includes processing a first signal that is outputted by a phase-rotator circuit, to produce a first clock signal and a second clock signal which is different from the first clock signal. Referring to the examples set forth with respect to the previous drawings, stage 510 may be carried out by clock circuitry 230. It is noted that stage 510 may include processing the first clock signal to produce the second clock signal. Method 500 may further include a stage (not illustrated) of processing an input signal of the electronic sub-integer frequency divider circuit by a prescaler circuit having a dividing factor A, thereby producing the plurality of phase-shifted signals from which the phase-shifted states are generated.

Referring to FIG. 4B, stage 510 may include stage 511 of processing the first signal by an integer divider to produce the first clock signal. Referring to the examples set forth with respect to the figures illustrating divider circuit 200, stage 511 may be carried out by first clock circuit 231, and more specifically, by one or more integer dividers 233 (e.g. 233.1, 233.2).

Referring to FIG. 4B, stage 510 may include stage 512 of processing the first clock signal by an integer divider to produce the second clock signal. Referring to the examples set forth with respect to the figures illustrating divider circuit 200, stage 512 may be carried out by second clock circuit 232, and more specifically, by one or more integer dividers 235. Stage 512 may follow stage 511, but may also be executed if stage 511 is not implemented.

Referring to FIG. 4C, stage 510 may include stage 513 of processing the first clock signal by a non-overlapping inverter to produce the second clock signal. As a result, the first clock signal and the second clock signal are non-overlapping signals having the same period (i.e. if the voltage of one of these signals exceeds a substantially-zero threshold, the voltage of the other signals must be below that threshold).

Referring to the examples set forth with respect to the figures illustrating divider circuit 200, stage 513 may be carried out by second clock circuit 232, and more specifically, by non-overlapping inverters, such as those known in the art. Stage 513 may follow stage 511, but may also be executed if stage 511 is not implemented.

Referring to stage 510 as a whole, it is noted that, conveniently, the first clock signal and the second clock signal are to be synchronized which each other (e.g. the rise and fall times of the first and the second clock signals should be synchronized with each other).

Referring to FIG. 5 which illustrates several signals in an electric sub-integer frequency divider circuit according to an embodiment of the invention, in the illustrated example the second clock signal is produced from the first clock signal using a ÷2 integer divider, and thus the period of the second clock signal (denoted $T_C$) is double that of the first clock signal (denoted $T_B$). It is noted that the signals illustrated in FIG. 5 may be produced by divider circuit 200 and/or by executing method 500. It is noted that the signals in FIG. 5 are illustrated as ideal square waves in which transitions between the high and low levels are instantaneous, for reasons of clarity only. In practice, the signals in divider circuit 200 (or in another system which executes method 500) would have non-zero rise and falls times (as reflected, for example, in FIG. 10).

Reverting to FIG. 4A, method 500 may include stage 520 of processing the second clock signal to provide a plurality of M signals having a period TP and of different phases; wherein the period TP is longer than the periods of the first and the second clock signals. Stage 520 may include producing the plurality of M signals from the second clock signal by an integer divider.

Referring to the examples set forth with respect to the previous drawings, stage 520 may be carried out by integer divider 240, which may be a CMOS integer divider (CMOS stands for Complementary metal-oxide-semiconductor).

Figure 13:
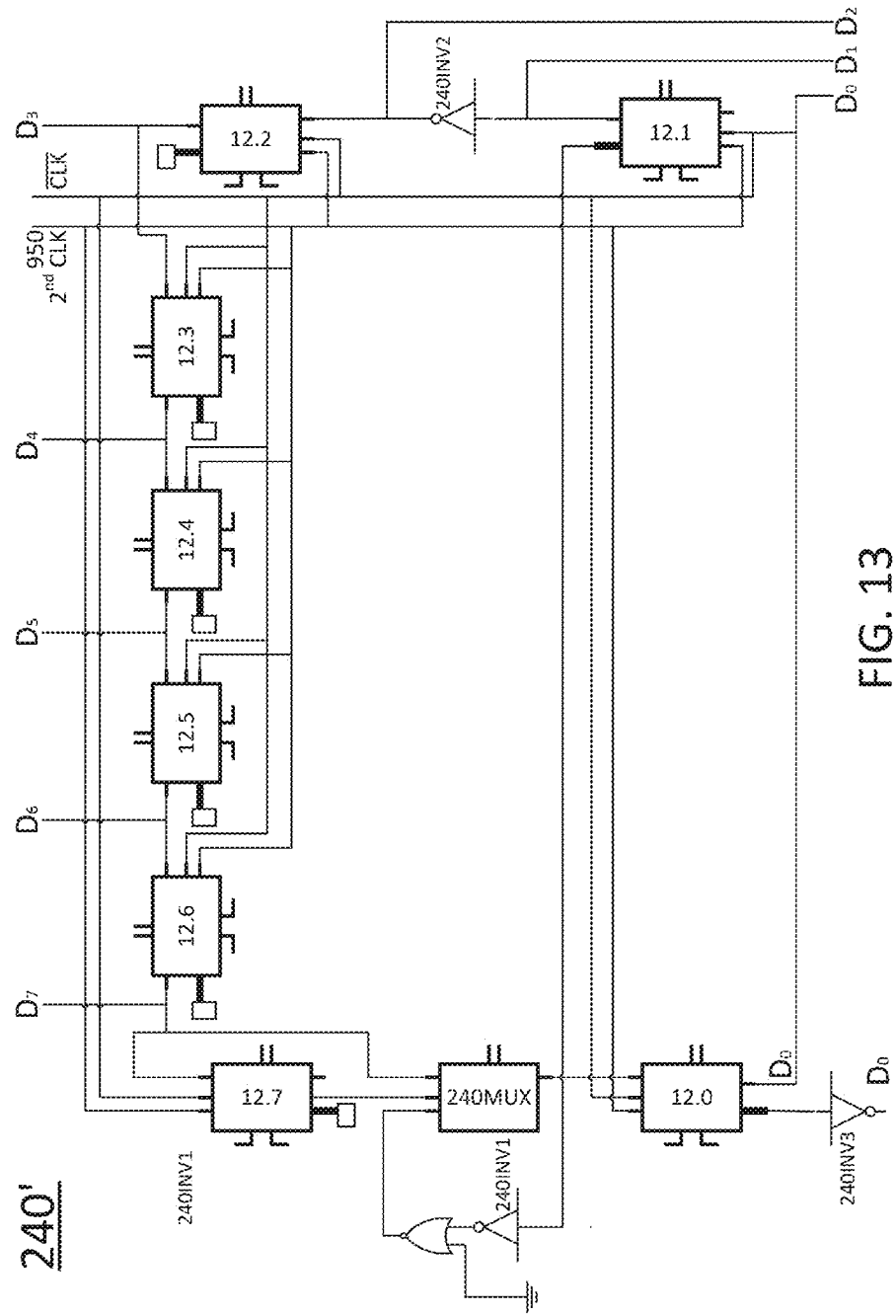
FIG. 13 illustrates an integer divider which may be used in the divider circuit of FIGS. 3, 6 and 11, according to an embodiment of the invention.

For example, FIG. 13 illustrates an integer divider which may be used as integer divider 240 (denoted 240'), according to an embodiment of the invention. The integer divider of FIG. 13 includes multiple flip-flops 12 which are arranged in a circular formation, as illustrated. Each of the flip flops 12 outputs one of the plurality of M signals—$D_0$ through $D_7$ in the illustrated example. The division rate of the illustrated integer divider 240' is 15. Referring to the example of FIG. 5, two out of the plurality of M signals are illustrated—$D_o$ and $D_i$. As can be seen, the second clock 950 is provided to integer divider 240' in two forms—the regular signal and the inverted signal.

Stage 550 of method 500 includes processing the second clock signal and at least one signal having a period TP, thereby producing a second signal which includes S pulses in each period TP. The processing of stage 550 is based on a control command, such as control command 990, and its different possible variations discussed above. The period TP is longer than the periods of the first and the second clock signals. Especially, the one or more signals within the period TP which are processed in stage 500 may be selected from the plurality of M signals generated in stage 520, if implemented. Referring to the examples set forth with respect to the previous drawings, stage 550 may be carried out by pulse generator 250, and especially by first-level and second-level circuitries thereof (252 and 253).

As aforementioned, the signal processing in stage 550 is based on a control command. Optional stages 530 and 540 exemplify some ways in which the processing of stage 550 may be based on such a control command.

Stage 530 includes receiving a control command which is indicative of a number of pulses (denoted NP) to be included in each period TP of a regulating signal, which is the regulating signal by which the phase-rotator circuit is controlled (e.g. the regulating signal by which a controller of the phase-rotator circuit—such as controller 260—operates). Referring to the examples set forth with respect to the previous drawings, the receiving of stage 530 may be carried out by one or more components of pulse generator 250. For example, in the example of FIG. 7, the control command 990 is received by multiplexer MX1 and by transistor 253TR1 (e.g. an NMOS transistor). It is noted that parts of the control command (or another control command) may be provided to other components of the divider circuit. For example, a direction-indicating control bit may be provided to the phase-rotator circuit or to a controller of which, for determining a direction of the rotation between the phase-shift states.

In FIG. 4A, a method is illustrated in which two different ways may be selected for the producing of the regulating signal—either by executing stage 561 or by executing stage 562. It is noted that this is not necessarily so, and more or less ways may be available in method 500. For example, in the example of FIG. 4F there is no selection of a way in which the regulating signal is produced.

Reverting to FIG. 4A, optional stage 540 includes determining whether the number of pulses NP indicated by the control command fulfils a certain decision criterion or not. For example, stage 540 may include determining whether NP is within a predefined range, whether NP is smaller or larger than a predefined threshold, and so on. For example, stage 540 may include determining whether NP is smaller or equal to L, where L denotes a number of possible periodic pulses of different duty cycles, and with a period TP which may be produced from the plurality of M signals (e.g. by the pulse generator, and especially by the first-level circuitry of which).

Stage 540 is followed either by stage 541 (if the decision criterion is met) or by stage 542 (if the decision criterion is not met). In both of these stages, the number of pulses S to be included in the second signal which is produced in stage 550 is determined. In stage 541 the number of pulses S is the indicated number NP, while in stage 542 the number of pulses S is different than NP, but is determined based on NP. Optionally, S is determined in stage 542 based only on NP and on one or more constants. For example, S may be determined to be NP minus the number of pulses G which may be added to the second signal for producing the regulating signal.

Stage 550, which was discussed above, includes producing the second signal. FIG. 4D illustrates optional sub-stages of stage 550, according to an embodiment of the invention.

Optional stage 551 includes inputting one or more of the M signals to a first-level circuitry which includes (a) a plurality of logical gates and (b) a multiplexer MX1 which is clocked by the second clock signal, and which is configured to selectively output, based on the control command, each out of a plurality of L possible periodic pulses of different duty cycles and with a period TP, thereby providing one of the L possible signal, whose duty cycle is responsive to the control command. Referring to the examples set forth with respect to the previous drawings, stage 551 may be carried out by pulse generator 250, and especially by the first-level circuitry 251. The control command may be directly used to indicate to the multiplexer which of its input to select.

Referring to the example of FIG. 5, stage 551 may be executed by inputting the two signals $D_0$ and $D_i$ to an AND logical gate (or to another type of logical gate, such as the ones denoted OR in FIG. 7) to produce the signal $P_j$. Other signals out of the L signals may be produced by inputting two of the M signals to another kind of logical gate (e.g. NOR gates, denoted NOR in FIG. 7). One of the L signals may be produced by simply providing one of the M signals, or by processing such a signal by a single-input logical gate (such as INV) in order to match the delay which the production of the other signals require. One of the L signals may be generated by providing a zero-signal (i.e. a signal whose duty cycle is 0). It is noted that in the L signals of varying duty cycle may include a signal with a duty cycle of 0 and/or a signal with a duty cycle of 1. Such signals are also considered to have a period of TP for the sake of the present discussion, because TP is the period of the control cycle.

Referring to stage 551 as a whole, the duty cycle of signal $P_j$ determines the number of pulses in the second signal produced therefrom (denoted $W_j$ in FIG. 5), and depends on the phase difference between the signals inputted to the local gate.

Optional stage 552 includes inputting the signal produced in stage 551 with the second clock signal to an AND logical gate which produces the second signal. Referring to the examples set forth with respect to the previous drawings, stage 552 may be carried out by pulse generator 250, and especially by the first-level circuitry 252 (in such case, the AND logical gate is gate 252AND). Referring to the example of FIG. 5, stage 552 may be executed by inputting signals $P_j$ and the second clock signal (denoted Tc) to an AND logical gate to produce the signal $W_j$.

Generally, stage 550 may include: (a) selecting a subgroup including up to two signals out of the M signals based on the control command; (b) processing the signals of the subgroup by at least one logic gate to produce a signal with a period TP whose duty cycle corresponds to the control command, and (c) inputting this signal with the second clock signal to an AND logical gate which produces the second signal.

Stage 560 of method 500 includes processing the second signal to produce the regulating signal. Referring to the examples set forth with respect to the previous drawings, stage 560 may be carried out by pulse generator 250, and especially by third-level circuitry 253.

Figure 4F:
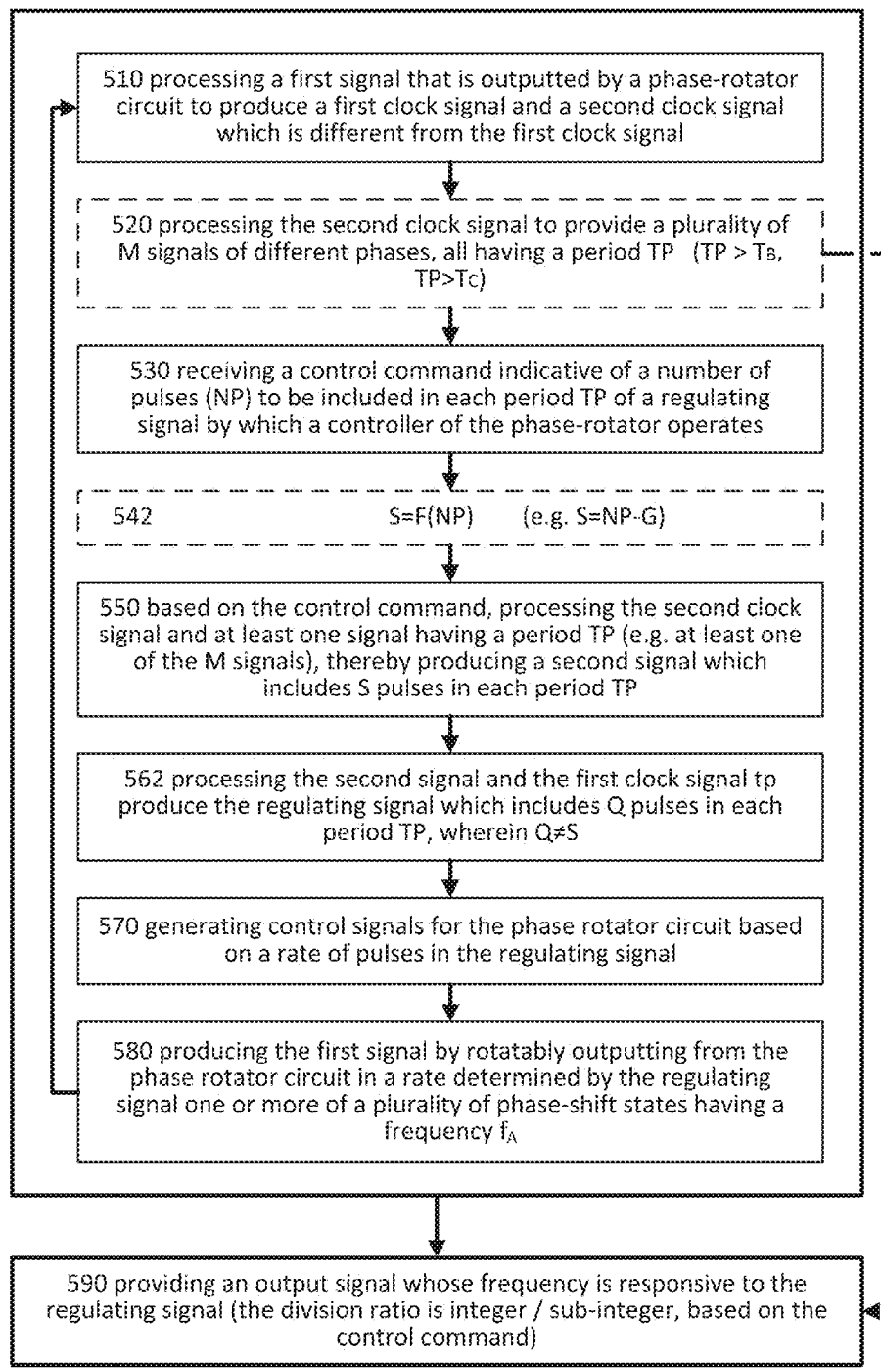
FIG. 4F illustrates a method for sub-integer frequency division, according to an embodiment of the invention.

Stage 560 may include a selection between several different ways for producing the regulating signal (e.g. by executing stage 561 or stage 562), but this is not necessarily so (e.g. as exemplified in FIG. 4F).

Stage 561 includes providing the regulating signal so that the regulating signal includes S pulses in each period TP. The second signal may be provided as is, but may also be processed. For example, it may be processed together with the first and/or the second clock signals, or another signal. For example, stage 561 may include multiplexing the second signal with a null signal (connected to electric ground) when the second clock signal is used to clock the multiplexer (referring to the example of FIG. 7, multiplexer MX2).

The regulating signal may also be produced using the second signal together the first clock in stage 561 (e.g. by inputting both to an AND logical gate, thereby producing shorter pulses in the example of FIG. 5).

Stage 562 includes processing the second signal and the first clock signal to produce the regulating signal which includes Q pulses in each period TP, wherein Q≠S. As stated above, referring to the examples set forth with respect to the previous drawings, stage 562 may be carried out by pulse generator 250, and especially by third-level circuitry 253.

Generally, method 500 includes processing the second signal to produce a regulating signal, and if a first criterion is fulfilled, producing the regulating signal by processing the second signal and the first clock signal, so that the regulating signal includes Q pulses in each period TP, wherein Q is different from S.

The first criterion may differ in different embodiments of the invention. Especially, it is noted that the first criterion may be an explicit decision criterion, but may also be an implicit requirement that must be fulfilled for the processing of stage 562 to occur.

For example, the first criterion may be the aforementioned certain decision criterion which pertains to the number of pulses NP indicated by the control command. In another alternative, the first criterion may be that the second signal must be stable (e.g. having the same number of pulses every period TP for at least H cycles), that the control command must be a valid command, etc.

The first criterion may pertain to the content of the control command, and especially, it may pertain to the number of pulses NP indicated in the control command (if the control command is implemented this way). For example, stage 560 may include producing the regulating signal based on the control command, so that the regulating signal includes Q pulses in each period TP (i.e. execute stage 562) if the control command fulfils the first criterion, and S pulses in each period TP (i.e. execute stage 561) otherwise.

For example, stage 560 may include determining whether NP is within a predefined range (e.g. the same range of stage 540, if applicable), whether NP is smaller or larger than a predefined threshold (e.g. the same threshold of stage 540, if applicable), and so on. For example, stage 560 may include determining whether NP is smaller or equal to L, where L denotes a number of possible periodic pulses of different duty cycles and with a period TP which may be produced from the plurality of M signals (e.g. by the pulse generator, and especially by the first-level circuitry thereof).

In the example of FIG. 7, the selection between the execution of stages 561 and 562 is done by transistor 253TR1 which is controlled by a bit b5. The bit may be the most-significant bit (MSB) of the number NP indicated in control command 990.

Stage 562 may be implemented by executed optional stage 563 which includes producing the regulating signal by processing the second signal and another signal to provide the regulating signal so that Q=S+G, wherein G is a preconfigured fixed number. That is, the difference between S and Q is irrespective of S. This may include "adding" or "injecting" pulses into the second signal. These extra pulses may be derived from that other signal, or may be generated by the processing of stage 563. G is an integer, and in different implementations any number of one or more values may be allowed for G: positive values, negative values, or both positive and negative values.

Stage 563 may optionally include executing stages 564 and 564. Stage 564 includes processing at least the first clock signal (and possibly also one or more of the M signals) to produce a third signal which includes a preconfigured fixed number Y of pulses (denoted signal H in FIG. 5), and stage 565 includes alternating between the second signal and the third signal to produce the regulating signal. The alternating may be executed by a multiplexer (such as multiplexer MX2) that is clocked using the second clock signal.

Referring to the example of FIG. 5, the signal denoted as "MUX CLOCK" is similar to the second clock signal, and it determines which of the following signals inputted to a multiplexer clocked by that signal will be used in its output: the second signal $W_j$ or the third signal H. the selection is illustrated by the dotted vertical lines rising from the rise and fall points of the MUX CLOCL signal. The vertical arrows coming down from signals $W_j$ and H indicate the part of each of these respective signals which is multiplexed into the regulating signal.

It is noted that optionally, several values G may be available for selection. For example, if the possible values of S are between $S_0$ and $S_{L-1}$ (i.e. L values), then a first value $G_0$ may enable generating regulating signals whose number of pulses is between $S_0+G_0$ and $S_{L-1}+G_0$, while a second value $G_1$ may enable generating regulating signals whose number of pulses is between $S_0+G_1$ and $S_{L-1}+G_1$. Generating a regulating signal having a number of pulses $S_t+G_0$ may require using the second signal and signal $H_0$, while generating a regulating signal having a number of pulses $S_t+G_1$ may require using the second signal and yet another signal $H_1$. It should be noted that a single such other signal $H_k$ may enable adding a preconfigured fixed number $G_k$ of pulses only for some of the possible second signals (e.g. only for signals having 0 to 8 pulses, only for signals having 4 to $S_{L-1}$, etc.). If multiple such signals H may be used, the different H signals may be generated from the first and/or the second clock, and possibly also from other clock signals produced from the first signal. For example, different signals H may be produced from different first clocks (as exemplified in FIG. 11). Different signals H may also be produced from a single clock, but with a different duty cycle, or with a different number of pulses Y included therein. In other implementations, only one value of G is available.

Stage 580 of method 500 includes producing the first signal (which is used in stage 510) by rotatably outputting from the phase rotator circuit (also mentioned with respect to stage 510) one or more of a plurality of phase-shift states having a frequency $f_A$. The rate of the rotation in which these phase-shift states are outputted in stage 580 is determined by the regulating signal (generated in stage 560), in such a way so that a frequency of the first signal is determined by the frequency $f_A$ and by the regulating signal. Referring to the examples set forth with respect to the previous drawings, stage 580 may be carried out by phase-rotator 220.

The rate of the rotation in which these phase-shift states are outputted in stage 580 may correspond to the rate of pulses in the regulating signal, and especially—it may correspond to the number of pulses in each period TP in the regulating signal.

Stage 580 may be preceded by optional stage 570 which includes generating control signals for the phase rotator circuit based on a rate of pulses in the regulating signal. Referring to the examples set forth with respect to the previous drawings, stage 570 may be carried out by phase-rotator controller circuit 260. An optional way in which such a phase-rotator controller circuit which executes stage 570 may operate is discussed with respect to FIGS. 8, 9 and 10.

The sequence of stages 570 and 580 may include: generating (in stage 570), based on the rate of pulses in the regulating signal, control signals for the phase rotator circuit; and producing the first signal (in stage 580) by rotatably outputting the one or more phase-shift states from the phase rotator circuit at a rate determined by the control signals, thereby producing a first signal whose frequency is determined by the frequency $f_A$ and by the control signals.

Stage 590 of method 500 includes providing an output signal whose frequency is responsive to the regulating signal. For at least some of the possible control commands (the control command may be changed from time to time when executing method 500, usually after a significant number of cycles of stages 510 to 580), stage 590 includes providing a sub-integer output signal whose frequency is responsive to the regulating signal. Optionally, for some of the possible control commands, the division ratio (between the frequency of the output signal of stage 590 to the frequency of an input signal from which the phase-shifted signals are generated) may also be an integer.

Optionally, the output signal is one of the plurality of M signals, or is a signal produced by processing thereof. However, the output signals may also be produced using other signals of divider circuit 200, such as the first or second clock signals.

FIG. 4F illustrates method 500, according to an embodiment of the invention. In the illustrated example, the regulating signal is always produced also by using the first clock.

Reverting to FIG. 3 and to the description of electric sub-integer frequency divider circuit 200. As aforementioned, divider circuit 200 may include phase rotator controller 260 which is configured to generate, based on the rate of pulses in the regulating signal, control signals for the phase rotator circuit. In such cases, phase rotator circuit 260 is configured to rotatably output the one or more phase-shift states at a rate determined by the control signals, thereby producing a first signal whose frequency is determined by the frequency $f_A$ and by the control signals.

Figure 8:
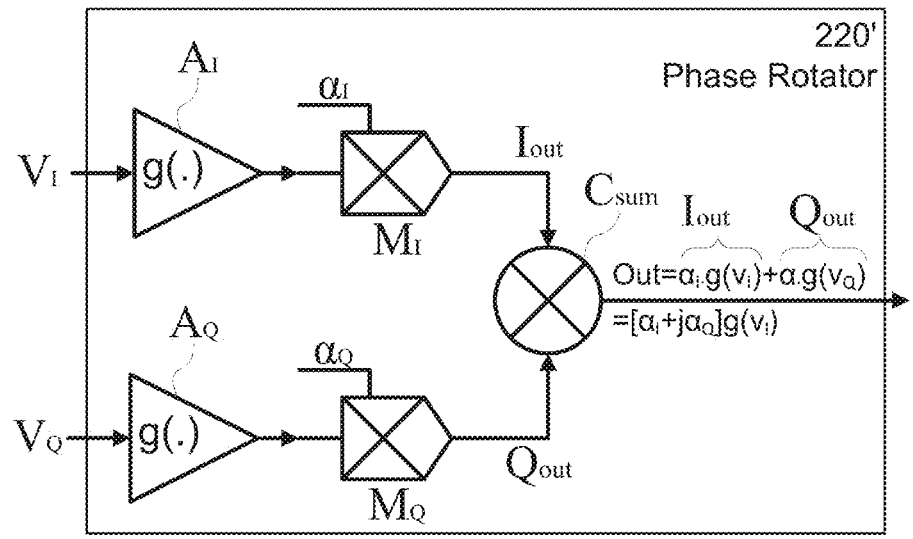
FIG. 8 illustrates a general architecture of a phase-rotator, according to an embodiment of the invention.

FIG. 8 illustrates a general architecture of a phase-rotator 220 (denoted 220'), according to an embodiment of the invention. Optionally, phase-rotator 220 may include: (a) an I-channel transconductance amplifier $A_I$ which provides its output to a corresponding multiplier $M_I$, (b) a Q-channel transconductance amplifier $A_Q$ which provides its output to a corresponding multiplier $M_Q$, and (c) a summing circuit Csum which sums the outputs of the multipliers $M_I$ and $M_Q$. The output of the summing circuit Csum is used as the output of phase-rotator 220.

This way the phase rotator (denoted 220') may perform phase interpolation of the differential I and Q phase input signals (denoted $V_I$ and $V_Q$, e.g. signals 920.1 and 920.2 in FIG. 3) based on control inputs $\alpha_I$ and $\alpha_Q$, which provide sign (+, −) control to the respective multipliers and which specify interpolation weighting factors, and then summing the differential I and Q input signals in the current or voltage domain with the appropriate weights to achieve a desired phase shift. The differential I and Q input signals are linearly combined (summed) in the current or voltage domain with appropriate weights to achieve a desired phase shift.

In the I-channel, the I-phase input phase signal (differential I phases) is amplified by the amplifier AI with a transconductance g that is controlled based on control input $\alpha_I$ to produce an output current $I_{out}=\alpha_I \cdot g(v_I)$. Similarly, in the Q-channel, the Q-phase input phase signal (differential Q phases) is amplified by the amplifier AQ with a transconductance g that is controlled based on control input $\alpha_Q$ to produce an output current $Q_{out}=\alpha \cdot g(v_Q)$. The output of the phase rotator (120') is generated by linearly combining the I and Q channel output currents via the summing circuit S to output an interpolated output current signal Out=$\alpha_I \cdot g(v_I)+\alpha \cdot g(v_Q)=[\alpha_I+j\alpha_Q]g(v_I)$.

In accordance with exemplary embodiments of the invention, the general phase rotator architecture of FIG. 8 may be used as a fundamental building block for implementing various phase rotators that can perform phase interpolation using a limited number of input phases (e.g., differential I and Q inputs), while a desired phase interpolation granularity (phase shift resolution) is obtained, based on the number M of control bits and phase rotator circuit topology implemented to achieve a desired phase-shift resolution.

Figure 9:
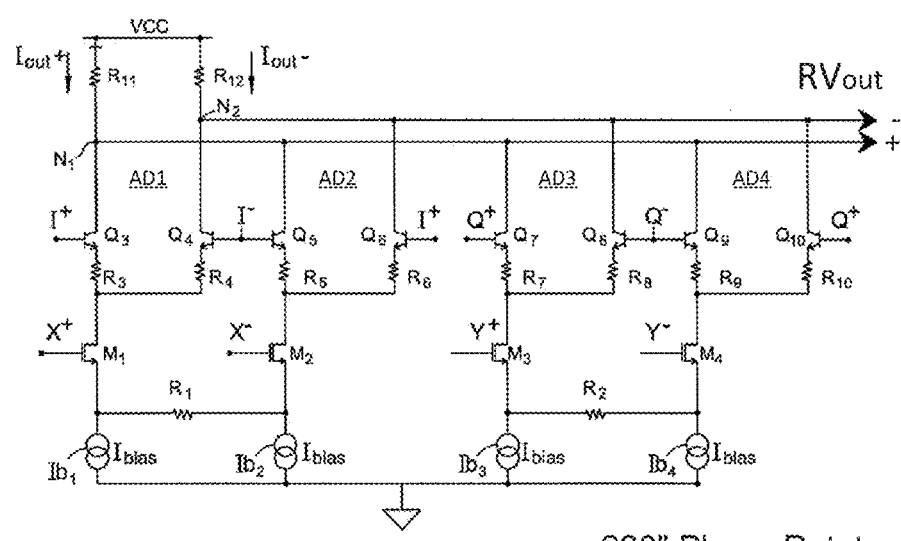
FIG. 9 is a schematic circuit diagram of a 2-bit phase rotator according to an embodiment of the invention.

FIG. 9 is a schematic circuit diagram phase rotator 220, according to an embodiment of the invention. The phase rotator 220 illustrated in FIG. 9 (denoted 220) is a 2-bit phase rotator 220" according to an embodiment of the invention. In particular, FIG. 9 illustrates a 2-bit phase rotator (220") having a framework that is based on the conceptual current-current-controlled phase interpolation framework of FIG. 8.

The inputs to phase rotator 220" include differential analog I and Q signals and differential digital X and Y control signals (which may be provided by phase-rotator controller 260, based on the regulating signal 970). The signal inputs ports I+, Q+, I− and Q− receive as input the I, Q, Ī, Q̄ (0, π/2, π and 3/2·π radians) phase input signals (e.g. signals 920.1 through 920.4 in FIG. 3), respectively, as well as a 2-bit control signal applied as differential phase select control signals to control ports X+/X− and Y+/Y−. Phase rotator 220" includes four differential amplifiers AD1 through AD4 which are formed, in part, by BJT (bipolar junction transistor) pairs (Q3/Q4), (Q5/Q6), (Q7/Q8) and (Q9/Q10) and corresponding emitter resistors R3/R4, R5/R6, R7/R8 and R9/R10.

The differential pairs (Q3/Q4) and (Q5/Q6) provide duplicate transconductance (amplification) stages for the differential amplifiers AD1 and AD2, where the differential I input phases are applied to the base terminals of transistors (Q3, Q4, Q5, and Q6) as shown. In particular, the I channel duplicate transconductor pairs (Q3-Q4) and (Q5-Q6) are wired such that the base terminals of Q3 and Q4 are connected to I+ and I−, respectively, and the base terminals of Q5 and Q6 are connected to I− and I+, respectively. Similarly, the differential pairs (Q7/Q8) and (Q9/Q10) provide duplicate transconductance (amplification) stages for the differential amplifiers AD3 and AD4, where the differential Q input phases are applied to the base terminals of transistors (Q7, Q8, Q9 and Q10) as shown. In particular, the Q channel duplicate transconductor pairs (Q7/Q8) and (Q9-Q10) are wired such that the base terminals of Q7 and Q8 are connected to Q+ and Q−, respectively, and the base terminals of Q9 and Q10 are connected to Q− and Q+, respectively.

The phase rotator 220" further includes a plurality of current sources Ib1, Ib2, Ib3 and Ib4 that provide bias currents for the differential amplifiers AD1, AD2, AD3 and AD4. The current sources are connected to the differential pairs through corresponding NMOS transistors M1, M2, M3 and M4 which operate as switches that are controlled by the differential phase interpolation control signals X and Y. The switches M1 and M2 are controlled by differential phase control inputs X+ and X− such that only one of the differential amplifiers AD1 and AD2 for the different I input phases is enabled at any one time, and the switches M3 and M4 are controlled by the differential phase control inputs Y+ and Y− such that only one of the differential amplifiers AD3 and AD4 for the differential Q input phases is enabled at any one time. In other words, the differential phase select signals X and Y operate to control the switches M1, M2, M3 and M3 such that the phase rotator 220" will perform phase interpolation between an I phase signal and a Q phase signal to provide phase interpolated output currents $I_{out}+$ and $I_{out}−$ flowing through output load resistors R11 and R12, respectively, and thereby convert the phase mixed output current signal to a differential output signal $V_{out}$ on nodes N1 and N2.

Figure 10:
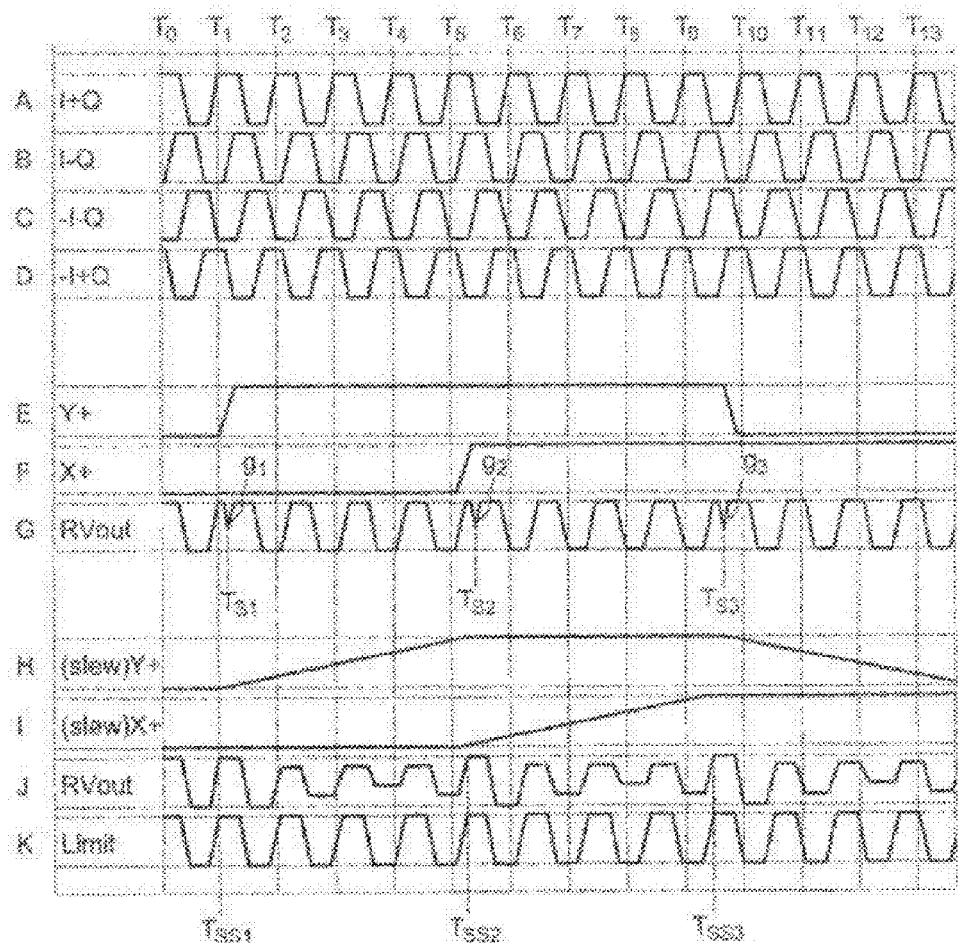
FIG. 10 is a waveform timing diagram illustrating optional modes of operation of a phase rotator, according to an embodiment of the invention.

FIG. 10 illustrates a possible mode of operation of phase rotator 220, and especially of phase-rotator 220", according to an embodiment of the invention. In particular, FIG. 10 is an exemplary waveform timing diagram to illustrate a phase rotation and interpolation operation of the phase rotator of FIG. 9. In FIG. 10, a plurality of waveforms A, B, C and D represent a corresponding one of the output phases (i.e. phase-shift states) of phase rotator 220, namely, I+Q, I−Q, −I+Q, and −I−Q, respectively. The waveforms A, B, C and D are presented over a period from time T0 to T13 covering 13 full cycles of each of the phase-shifted states. It is to be noted that the waveforms are depicted as being trapezoidal-shaped waveforms for simplicity, although in practice the input signals would be more sinusoidal.

Waveforms E and F illustrate exemplary phase interpolation control signals Y and X that are applied to the respective Y+ and X+ control inputs of the phase rotator 220" over the time period T0 to T13. Waveform G illustrates the output signal RVout of the phase rotator 220, which is generated over the time period T0 to T13 as a result of the phase interpolation control signals X and Y. The phase rotator 220 rotates to a next phase state on rising and falling edges of the phase interpolation control signals.

FIG. 10 illustrates output waveform $RV_{out}$ of the phase rotator 220 over the time period T0 to T13, which rotates to successive phase states (I+Q)→(I−Q)→(−I−Q)→(−I+Q) at certain times (e.g., referring to FIG. 9, according to the logic states of the differential phase interpolation control signals X and Y applied to the switches M1, M2, M3 and M4). The following Table I illustrates the output phase of phase rotator 220" based on the logic levels of the X and Y signals applied to the phase interpolation control ports X+, X−, Y+ and Y− of the phase rotator 220" in FIG. 9.

TABLE 1

| X+ | X− | Y+ | Y− | $RV_{OUT}$ |
|----|----|----|----|-----------|
| L  | H  | L  | H  | I + Q     |
| L  | H  | H  | L  | I − Q     |
| H  | L  | H  | L  | −I − Q    |
| H  | L  | L  | H  | −I + Q    |

As depicted by waveforms E and F in FIG. 10, at time T0, the differential phase control signal is generated such that a logic "0" is applied to the Y+ and X+ control ports. Although not depicted in FIG. 10, a logic level "1" is applied to the X− and Y− phase interpolation control ports. As a result, referring to FIG. 9, switches M2 and M4 are "On" providing bias current to enable differential amplifiers AD2 and AD4, while switches M1 and M3 are "Off" to disable differential amplifiers AD1 and AD3. As a result, the output current $I_{out}+$ is equal to the sum of collector currents of Q5 and Q9, and the output current $I_{out}−$ is equal to the sum of the collector currents of Q6 and Q10. Therefore, voltage at output node N1 is an amplified signal of the sum of the +I and +Q input phases (the differential output $RV_{out}$ is I+Q). Therefore, as shown in FIG. 10, the output waveform G is the waveform A between T0 and T1.

Next, at time T1, the differential phase control signal applied to Y+ begins to transition from Low to High during the period between T1 and T2. In this state, a logic "1" is applied at the Y+ and X− control ports, while a logic "0" is applied to the Y− and X+ control ports. As a result, referring to FIG. 9, switches M2 and M3 are "On" providing bias current to enable differential amplifiers D2 and D3, while switches M1 and M4 are "Off" to disable differential amplifiers AD1 and AD4. As a result, the output current $I_{out}+$ is equal to the sum of collector currents of Q5 and Q7, and the output current $I_{out}-$ is equal to the sum of the collector currents of Q6 and Q8. Therefore, voltage at output node N1 is an amplified signal of the sum of the +I and −Q input phases (the differential output RVout is I−Q). Therefore, as shown in FIG. 10, the output waveform g switches from waveform A to waveform B at time Ts1.

Next, at time T5, the differential phase control signal applied to X+ begins to transition from Low to High during the period between T5 and T6. In this state, a logic "1" is applied at the Y+ and X+ control ports, while a logic "0" is applied to the Y− and X− control ports. As a result, referring to FIG. 9, switches M1 and M3 are "On" providing bias current to enable differential amplifiers AD1 and AD3, while switches M2 and M4 are "Off" to disable differential amplifiers AD2 and AD4. As a result, the output current $I_{out}+$ is equal to the sum of collector currents of Q3 and Q7, and the output current $I_{out}-$ is equal to the sum of the collector currents of Q4 and Q8. Therefore, voltage at output node N1 is an amplified signal of the sum of the −I and −Q input phases (the differential output RVout is −I−Q). Therefore, as shown in FIG. 10, the output waveform G switches from waveform B to waveform C at time Ts2.

Next, during the period between T9 and T10, the differential phase control signal applied to Y+ begins to transition from High to Low. In this state, a logic "0" is applied at the Y+ and X− control ports, while a logic "1" is applied to the Y− and X+ control ports. As a result, referring to FIG. 9, switches M1 and M4 are "On" providing bias current to enable differential amplifiers AD1 and AD4, while switches M2 and M3 are "Off" to disable differential amplifiers AD2 and AD3. As a result, the output current $I_{out}+$ is equal to the sum of collector currents of Q3 and Q9, and the output current $I_{out}-$ is equal to the sum of the collector currents of Q4 and Q10. Therefore, voltage at output node N1 is an amplified signal of the sum of the −I and +Q input phases (the differential output $RV_{out}$ is −I+Q). Therefore, as shown in FIG. 10, the output waveform G switches from waveform C to waveform D at time Ts3.

In the above example, the phase rotator 220" rotates to a next phase state on rising and falling edges of the phase interpolation control signals. As depicted in FIG. 10, since the control signals are not properly aligned with the I/Q signals, glitches g1, g2 and g3 occur in the output signal $RV_{out}$ at each phase transition time Ts1, Ts2 and Ts3. These glitches are not desirable for various reasons. For example, such glitches can propagate into timing errors further downstream. A primary cause of misalignment is due to the fact that the circuit generating the control signals operates asynchronously with respect to the I/Q signals. Therefore, one cannot be sure of the state of the input signals when a transition occurs. Various methods may be used to prevent glitches due to the phase transition. For example, one solution is to "re-time" the control signals using the differential I and Q phase inputs using known techniques. These solutions, however, are costly in terms of large power consumption and amount of silicon real estate needed to implement re-timing circuits.

A more practical approach to preventing glitches in the output signal of the phase rotator is to implement a slewing functionality that enables the phase rotator to gradually shift from one state to the next. Slewing from one state to the next means, for example, switching smoothly from I+Q to I−Q. This can be achieved by gradually turning the Q current off and back on again, transitioning from I+Q, to I, to I−Q. In one exemplary embodiment of the invention, a glitch free output may be realized by controlling the rise and fall times (slew rates) of the phase interpolation control voltages X and Y at the gate terminals of the switches M1, M2, M3 and M4 so that a gradual switching between the two polarities at the differential control inputs is realized.

For example, in the exemplary embodiment of FIG. 9, the transition time between the two polarities at the control inputs X+/X− and Y+/Y− can be controlled by the transconductance of the current switches M1/M2 degenerated by resistor R1 and the by the transconductance of the current switches M3/M4 degenerated by resistor R2. Moreover, switching can be further controlled by adding RC filter networks to the input driving networks for control inputs X+/X− and Y+/Y− (e.g., at the gates of M1 through M4), which are designed with the appropriate RC time constants to achieve a given slew rate, as is understood by those of ordinary skill in the art. With such methods, however, the slew rate control is integrated within the framework of the phase rotator resulting in a more complex architecture and making the phase rotator less application independent.

In accordance with exemplary embodiments of the invention, M-bit phase rotators may be implemented with a slewing control functionality to realize a smooth transition from one state to the next when performing a phase transition using slew rate control techniques that are essentially independent of the specific phase rotator topology.

It is noted that divider circuit 200 may include a an output limiter 225 (which may be part of the phase-rotator 220 or external to it) and/or a slewing buffer (which may be part of phase-rotator 220, part of controller 260, or external to both).

The limiter 225 and slewing buffer may operate in conjunction with the phase rotator 220 to implement a phase rotating slewing functionality that enables the phase rotator 220 to gradually transition from one phase state to the next. In general, this optional slewing buffer may operate to delay or otherwise increase the slew rate (rise time) of phase switch control pulses that are output from, e.g., the modulus controller (140) (FIG. 2) or rotator controller 260 (FIG. 3) so as to obtain a glitch free output signal from the phase rotator (120).

The optional limiter 225 may operate to maintain a constant amplitude of the output signal from the phase rotator 220 by compensating for decreases in the amplitude of the output signal of the phase rotator 220 which may occur by virtue of performing phase shifting with slewed control signals.

The optional slewing buffer may be implemented using circuits and methods well-known to those of ordinary skill in the art to realize a fixed or programmable slew rate control functionality. For example, the slewing buffer may be implemented using a differential amplifier with a capacitive load, where the capacitance is selected to realize a desired slew rate based on the range of operating frequencies for the intended application. The capacitive load may be implemented using a programmable capacitor (e.g., varactor) to enable a programmatic slew rate control using known techniques. Moreover, the limiter 225 may be implemented using known circuit architectures that are suitable for the intended application.

An exemplary mode of operation of the phase rotator 220 (which includes a slewing buffer) will be discussed with reference to FIGS. 7 and 8. The control signal waveforms E and F as illustrated in FIG. 10 are input to the slewing buffer to generate corresponding slewed control signals H and I (as illustrated in FIG. 10) The slewed control signals H and I allow for gradual shifting from one phase-shift state to the next.

In FIG. 10, waveform J illustrates the phase rotator output $RV_{out}$ over time T0 to T13, where the output switches from waveform A to waveform B at time Tss1, from waveform B to waveform C at time Tss2 and from waveform D to waveform A at time Tss3. As compared to the output waveform G, the slewed control signals of waveforms H and I prevent glitches from being generated in the output waveform J at the phase state switches.

The slewed control signal waveforms H and I allow the output to switch smoothly from I+Q to I−Q, for example by gradually turning the Q current off and back on again, transitioning from I+Q, to I, to I−Q. As depicted by the phase rotator output waveform J in FIG. 10, the slewing control results in the output signal amplitude being decreased by 1.4 or 3 dB. The reason for this amplitude decrease can be illustrated in phasor notation, as follows:

$$I = A \cdot \cos(\omega \cdot t)$$

$$Q = A \sim \cos(\omega \cdot t - \pi/2)$$

$$I + Q = \sqrt{2} \cdot A \cdot \cos(\omega \cdot t - \pi/4)$$

As the phase rotator output transitions from I+Q to I−Q, passing through I, the output amplitude changes from 1.414 A to A and back to 1.414 A again, resulting in a 3-dB drop. The optional limiter amplifier 225 at the output of the phase rotator 220 operates to compensate for the decrease in amplitude. For example, in FIG. 10, the output waveforms J of the phase rotator is input to the limiter 225 and the limiter 225 restores the phase rotator output waveform J to its proper level, yielding a glitch-less constant-envelope signal represented by waveform K in FIG. 10. As the number of bits in the rotator increases, the need for slewing control to avoid glitches is reduced.

It is to be noted that the exemplary embodiment in FIG. 9 merely illustrates one exemplary embodiment of a 2-bit phase rotator designed to perform phase interpolation between differential I Q signals to achieve 4 different output phases I+Q, I−Q, −I+Q, and −I−Q, providing a phase shift resolution of π/2 radians between phase states. It should be noted that in this example, 4 different output phases (M=2) can be achieved simply using the differential IQ signals, where a phase multiplexer can be used to sequentially select and output each of the different I Q input phases 0, π/2, π, and 3π/2, to achieve a phase shift resolution of π/2 radians. However, this technique can result in fractional spurs due to imprecise quadrature accuracy of the differential IQ phase signals input to the phase rotator. To mitigate fractional spurs, phase rotators according to exemplary embodiments of the invention are preferably implemented such that every phase signal output from the phase rotator is generated by interpolation between the input I and Q phases. This results in calibrating the quadrature relationship, and therefore realizes fractional division with very small fractional spurs.

The exemplary 2-bit rotator framework of FIG. 9 can be extended based on the conceptual framework of FIG. 8 to realize higher phase shift granularity using the differential IQ inputs (4 input phases) by increasing the number of control bits to adjust the ratio of bias currents in the I and Q channel differential amplifiers and generate more phase states based on the relative weighting of the differential output signals. For instance, in FIG. 9, the differential control signals X and Y (two bit resolution) provide switch control to connect the current sources in each of the IQ branches to an appropriate I and Q-channel differential amplifier to thereby phase interpolate (linearly combine) one of each of the I and Q phase input signals, and thereby generate output signals with phase states of ⅛·π, ⅜·π, ⅝·π, and ⅞·π. Given the symmetry of the differential transistor pairs, output resistive loads and current sources, the differential amplifiers that are enabled in the I and Q channels will have the same bias currents, and thereby generate differential I and Q outputs having equal weights (in terms of magnitude), but having different polarities to generate a desired output phase in the phase quadrant specified by the control signals.

It is to be appreciated that the exemplary phase rotator embodiment of FIG. 9 could be extended to include variable current sources in the I and Q channel branches, wherein control bits can be applied to enable/disable the I/Q differential amplifiers to select one of the I and Q input phases for interpolation, while using the remaining bits as control inputs to control the variable current sources and selectively vary the bias currents for the enabled differential amplifiers, for the purpose of generating I and Q differential outputs that are weighted relative to each other in proportion to the weighted bias currents. In the embodiment of FIG. 9, each of the current sources can be implemented as bias currents (current digital-to-analog converters), which generate a bias current that varies, based on the digital control bit values, as is known in the art.

Alternatively, it is to be appreciated that another exemplary phase rotator embodiment of FIG. 9 can be extended to arbitrary phase resolution by replacing control signals X+, X−, Y+, and Y− with analog signals which are used to weight the currents and therefore realize phase interpolation. In this case, the current sources Ib1, Ib2, Ib3, and Ib4 are fixed, while their weights are controlled by analog signals X+, X−, Y+, and Y−.

FIG. 7 illustrates pulse generator 250, according to an embodiment of the invention. Optionally, pulse generator 250 is configured to produce the regulating signal based on the control command, so that the regulating signal includes Q pulses in each period TP if the control command fulfils a first criterion, and S pulses in each period TP otherwise. FIG. 7 illustrates one of the ways in which pulse generator 250 may be so configured.

FIG. 7, which will be discussed together with FIG. 5, is a wave-form illustration in which multiple signals, which may be produced in divider circuit 200 are illustrated, according to an embodiment of the invention. Especially, these wave forms may represent signals which may be produced by the pulse generator as illustrated in FIG. 7. However, other variations of pulse generator 250 may produce similar signals.

Pulse generator 250 of FIG. 7 is conceptually divided into three parts of circuitry, which are referred to as a manner of convenience only as "first-level", "second-level" and "third-level" circuitries. The term "level" here does not suggest any hierarchy of importance or level of signal processing, but rather an order in which the outputs of the first level circuitry are provided to the second level circuitry, and the outputs of the second level circuitry are provided to the third level circuitry. The second-level circuitry 252 is therefore electrically connected to both circuitries 251 and 253.

The first-level circuitry 251 includes a plurality of logical gates and a multiplexer MX1 which is clocked by the second clock signal. The order-relations between the logical gates and the multiplexer MX1 may vary. In the illustrated example, the multiplexer MX1 is configured and has a plurality of inputs which are connected to logical gates (denoted OR, NOR, and INV). Another input of the multiplexer MX1 in the illustrated example is connected to a null signal $P_0$.

Generally, the first-level circuitry 251 is configured to receive as input one or more of the M signals and to selectively output, based on the control command 990, each out of a plurality of L possible periodic pulses of different duty cycles and with a period TP. The periodic pulses are denoted $P_0$, $P_1$, $P_2$, and so on.

In the illustrated example, each of the plurality of L possible periodic pulses is provided to one of the inputs of multiplexer MX1, which selects which of its input ports to connect to its output port, based on the control command 990. In the illustrated example, the control command is an n-bit control command (in this case, a 6-bit control command), out of which the first n−1 bits are used by the multiplexer MX1 to identify the relevant input port.

For example, one or two of the plurality of M signals (e.g. signals $D_0$ and $D_i$ of FIG. 5) may be inputted to a logical gate (e.g. an AND logical gate, in the example of FIG. 5) to produce the signal $P_j$. Other signals out of the L signals may be produced by inputting two of the M signals to another kind of logical gate (e.g. OR and NOR gates, denoted OR and NOR in FIG. 7). One of the L signals may be produced by simply providing one of the M signals, or by processing such a signal (e.g. $D_0$ in the illustrated example) by a single-input logical gate (such as INV) in order to match the delay which the production of the other signals require. One of the L signals may be generated by providing a zero-signal (i.e. a signal whose duty cycle is 0). It is noted that the L signals of varying duty cycles may include a signal with a duty cycle of 0 and/or a signal with a duty cycle of 1. Such signals are also considered to have a period of TP for the sake of the present discussion, because TP is the period of the control cycle.

Optionally, for two of more of the plurality of L possible periodic pulses P, the multiplexer MX1 is configured to output one of the periodic pulse by selecting, in response to the control command, a signal provided to the multiplexer MX1 by one of the plurality of the logical gates which processes exactly two of the M signals to produce the periodic pulse.

The second-level circuitry 252 is configured to process the periodic pulse $P_j$ produced by the first-level circuitry 251 together with the second clock signal, to produce the second signal (denoted $W_j$ in the FIG. 5), which includes S pulses in each period TP. The number S of pulses is determined by the duty cycle of the respective periodic pulse $P_j$. In the illustrated example, there is a linear relationship between the two (because of the way the logical AND gate 252AND operates). However, other relationships may also be implemented. The periodic signal produced by first-level circuitry 251 is inputted with the second clock signal to logical AND gate 252AND of the second-level circuitry 252, which produces the second signal.

Referring to the example of FIG. 5, stage 552 may be executed by inputting signals $P_j$ and the second clock signal (denoted Tc) to an AND logical gate to produce the signal $W_j$.

The third-level circuitry 253 is configured to receive the second signal $W_j$ from the second-level circuitry 252, and to receive the first and second clock signals 240 and 250 from clock circuitry 230.

Third-level circuitry 253 includes circuitry 254 configured to process at least the first clock signal (and possibly also one or more of the M signals P) to produce a third signal H which includes a preconfigured fixed number Y of pulses. The number of pulses in the third signal H depends on the duty cycle of the selected periodic pulse P fed to this circuitry 254. To achieve the largest possible number Y, the second clock may be used in circuitry 254 instead of the selected periodic pulse ($P_{L-1}$ in the illustrated example).

In the illustrated example, circuitry 254 includes a logical AND gate 253AND which receives the selected periodic pulse (e.g. $P_{L-1}$) on one of its input ports. On its second input port, gate receives the first clock 950, thereby producing the signal H. Optionally, circuitry 254 may include a switch (e.g. transistor 253TR1) for selectively inputting to the second input port of gate 253AND a null signal, thereby resulting in producing of a null signal by the AND gate 253AND. The switch (e.g. transistor 253TR1) may be controlled by bit b5 of the control command 990. The bit may be the most-significant bit (MSB) of the number NP indicated in control command 990.

Third-level circuitry 253 also includes multiplexer MX2 that is configured to alternate between the second signal and the third signal to produce the regulating signal. Optionally (e.g. as illustrated), the second clock signal 950 clocks the multiplexer MX2.

The alternating between the second and the third signals according to the second clock is illustrated in FIG. 5, and is described above. It is noted that if a null signal is provided by the 253AND gate, then the multiplexing of the null signal and the second signal (which is produced by processing the second clock signal) when the second clock signal is also used as the clock for the alternation—results in providing of a signal which closely resembles the second signal (based on the switching timing in the multiplexer MX2, etc.).

Pulse generator 250 may optionally be configured to produce the regulating signal by processing the second signal and another signal (e.g. the third signal H) to provide the regulating signal 270 so that Q=S+G, wherein G is a preconfigured fixed number. It is noted that G is not necessarily equal to Y. For example, in the illustrated example (in which the second clock signal is produced from the first clock signal by a ÷2 integer divider), only half of the pulses of the third signal end up being included in the regulating signal.

Generally, pulse generator 250 may optionally be configured to select a subgroup including up to two signals out of the M signals based on the control command, to process (e.g. the circuitry 251) the signals of the subgroup by at least one logic gate to produce a signal with a period TP whose duty cycle corresponds to the control command, and to input this signal with the second clock signal to an AND logical gate which produces the second signal (in circuitry 252). The aforementioned selection of the subgroup may be direct (e.g. by selecting the signals themselves) or indirect (e.g. by selecting the input of the multiplexer which is connected to a logical gate to which the selected signals are inputted).

Referring to method 500 and to divider circuit 200 (and especially to pulse generator 250), it is noted that the desired division ratio may be changed from time to time (by modifying the control command respectively). In such cases, the operation of the pulse generator transitions between the numbers of pulses it outputs. The pulse generator may change in a relatively short time, depending on its internal propagation time (e.g. with propagation time equivalent to 5 muxes). For example, this may take about 1 ns or so. After this time, as will be clear to a person who is of skill in the art, the operation will return to regular operation, with the new number of pulses (hence also the new division ratio) operating as discussed above.

The initiation of the process should also be mentioned. For example, referring to the example of FIG. 13, at start up, all the D flip flops are set to VDD so the output of the whole divider 240 is VDD, until all the signals finish propagating from the entrance to the entrance of the divider 240. This may take, for example, about 300 pS. At the start up, there are not any pulses from the pulse generator at that time, since the first and second clock signals are created at about the same time as the signals reach the divider 240. After this time period has passed, the divider 240 starts dividing the second clock signal and the pulse generator starts working as described above, resulting in its steady state operation.

A pulse generator may be implemented according to the teachings of the present invention, which includes (i) a first-level circuitry which includes a plurality of logical gates and a multiplexer which is clocked by a second clock signal; the first-level circuitry being configured to (a) receive as input one or more of a plurality of M signals having a period TP and of different phases which are provided to the pulse generator, and (b) to selectively output, based on a control command, each out of a plurality of L possible periodic pulses of different duty cycles and with a period TP; (ii) a second-level circuitry being configured to process one or more of the L periodic pulses and the second clock signal, to produce a second signal which includes S pulses in each period TP; (iii) a third-level circuitry being configured to process the second signal and a first clock signal to produce a regulating signal so that it includes Q pulses in each period TP, wherein Q is different from S; and (iv) an electrical connection (e.g. RGL_OUT) for transmitting the regulating signal from the third-level circuitry toward a phase-rotator of an electronic sub-integer frequency divider circuit in which the pulse generator is included, thereby causing the electronic sub-integer frequency divider circuit to operate in a sub-integer division ratio mode. In such a pulse generator, the first clock signal and the second clock signal which is different from the first clock signal may be produced by a processing of a first signal whose frequency is determined by a rate of pulses in the regulating signal and which is outputted by the phase-rotator circuit which rotatably outputs, at a rate determined by the rate of pulses in a regulating signal, one or more of a plurality of phase-shift states having a frequency $f_A$; wherein the period TP is longer than the periods of the first and the second clock signals.

FIG. 6 is a block diagram of an electric sub-integer frequency divider circuit 200, according to an embodiment of the invention.

Clock circuitry 230 may include an integer frequency divider 235, wherein the second clock signal 950 is produced from the first clock signal 940 by an integer frequency divider. This way, the frequency of the second clock signal 950 is smaller than a frequency of the first clock signal 940.

As aforementioned, this is not necessarily so and other relationships between the first and the second clock may also be utilized. For example, the first clock signal and the second clock signal may be non-overlapping signals having the same period. In such cases, second clock circuit 232 may include a non-overlapping inverter (not illustrated) which is configured to process the first clock signal 940 to produce the second clock signal 950. As a result, the first clock signal and the second clock signal are non-overlapping signals having the same period (i.e. if the voltage of one of these signals exceeds a substantially-zero threshold, the voltage of the other signals must be below that threshold).

It is noted that divider circuit 200 may use different kinds of logic families, e.g. CMOS and ECL (Emitter-coupled logic). Thus, divider circuit 200 may include two (or more) converters—one from ECL to CMOS (converter 234) and one converting back (converter 261). The order between the first and/or the second clock circuit to the converter 234 may vary, and likewise the order between rotator controller 260 and converter 261.

The plurality of M signals may be produced from the second clock signal 950 by an integer divider 240 (having a dividing factor P) that is connected to the clock circuitry and to the pulse generator. For example, divider 240 may be an integer divider.

Optionally, first clock circuit 231 may include an integer divider (which may include one or more integer dividers 233).

In such cases, first clock circuit 231 may be configured to process the first signal 930 by that integer divider to produce the first clock signal 940.

Referring by way of example to divider circuit 200 as illustrated in FIG. 6, it is noted that divider circuit 200 may include:

a prescaler circuit 210 having a dividing factor A, being configured to receive an input signal 910 of the electronic sub-integer frequency divider circuit 200 and to process it to produce the plurality of phase-shifted signals from which the phase-shifted states are generated;

an integer divider 233 having a dividing factor B (e.g. $B=B_1 \cdot B_2$), being configured to process the first signal to produced the first clock signal;

an integer divider 235 having a dividing factor C, being configured to process the first clock signal to produce the second clock signal; and an integer divider 240 having a dividing factor P, being configured to process the second clock signal to produce the plurality of M signals.

In that case, the electronic sub-integer frequency divider circuit 200 has a sub-integer-dividing factor equal to $A \cdot (BCP+(\Delta\phi/2\pi) \cdot (S+b*G))$, where $\Delta\phi$ denotes a minimum phase shift possible from the phase rotator 920 and where b is equal to 0 if the second signal is used as the regulating signal (possibly with some processing, as in alternating it with a null signal in a multiplexer clocked by the second clock signal), or b=1 if the third signal is used in the producing of the regulating signal.

A, B, C and P are integer values ≥1.

Figure 11:
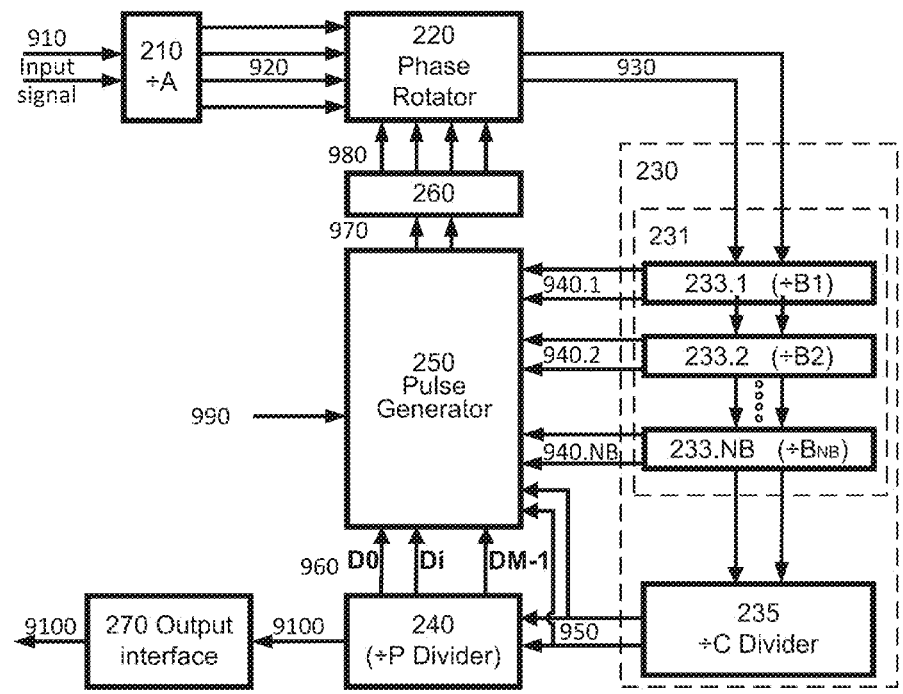
FIG. 11 is a block diagram of an electric sub-integer frequency divider circuit 200, according to an embodiment of the invention.

FIG. 11 is a block diagram of an electric sub-integer frequency divider circuit 200, according to an embodiment of the invention. In the illustrated example, clock circuitry is configured to produce multiple first clock signals 940.1 through 940.NB, having two or more different frequencies. The pulse generator 250 in this example may use any of these first clocks which are provided to which for adding a different number of pulses to the second signal, thereby extending the range of possible pulses even further for a given selection of second signals (e.g. $S_0$ through $S_{L-1}$).

Figure 12:
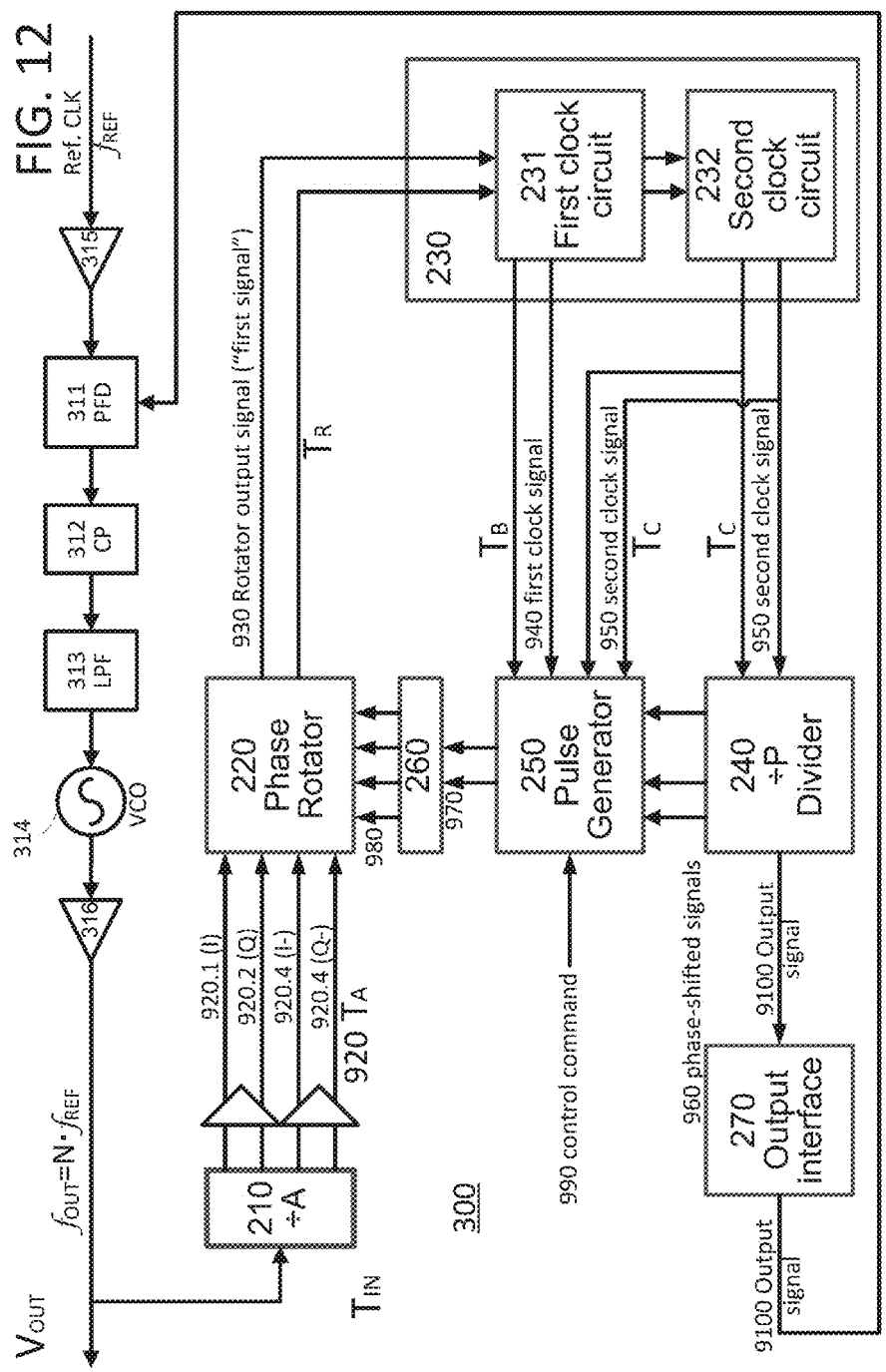
FIG. 12 is a block diagram of a phase-lock-loop frequency synthesizer, according to an embodiment of the invention.

FIG. 12 is a block diagram of a phase-lock-loop frequency synthesizer 300, according to an embodiment of the invention. The sub-integer frequency divider circuit 200 discussed above may be used to construct PLL (phase-locked loop) frequency synthesizer circuits, which include a phase detector 311, a low pass filter 313 connected to the output of the phase detector, and a VCO (voltage controlled oscillator) 314 connected to the output of the low pass filter 313, wherein the fractional frequency divider circuit 200 is connected in a feedback loop between an output of the VCO 314 and an input to the phase detector 311.

It is to be appreciated that the programmable frequency divider circuit 220 may be implemented in various applications that require generation of output signal frequencies that have arbitrary sub-integer N division factors of an input (reference) signal frequency. By way of example, the exemplary frequency divider circuit 200 of FIG. 3 can be implemented with a phase-locked loop 300 circuit to realize a sub-integer-N PLL frequency synthesizer circuit, such as depicted in FIG. 12.

In particular, FIG. 12 is a high-level schematic illustration of a PLL frequency synthesizer circuit 300, which includes an optional input buffer/amplifier 315, a PFD (phase-frequency detector) circuit 311, an optional charge pump 312, a loop filter 313, a VCO (voltage controlled oscillator) circuit 314, an optional output buffer amplifier 316 and the frequency divider 200 of FIG. 3 in a PLL feedback loop.

The PLL 300 operates similar to the PLL 10 of FIG. 1, but with the benefits achieved by the novel divider circuit 200. The output signal $V_{out}$ is fed back to the PFD 311 via the sub-integer N frequency divider circuit 200, which performs programmable frequency division operations as discussed herein, and which generate a low frequency signal fDiv, to achieve fRef=fDiv where the PLL frequency synthesizer achieves the desired "locked" state. PLL 300 is a phase-locked loop frequency synthesizer, which includes: a phase detector; a low pass filter connected to the output of the phase detector; a voltage controlled oscillator (VCO) connected to the output of the low-pass filter; a fractional frequency divider circuit connected in a feedback loop between an output of the VCO and an input to the phase detector, wherein the fractional frequency divider circuit includes: (i) a phase rotator circuit configured to rotatably output, at a rate determined by a rate of pulses in a regulating signal, one or more of a plurality of phase-shift states having a frequency $f_A$, thereby producing a first signal whose frequency is determined by the frequency $f_A$ and by the regulating signal; (ii) a clock circuitry configured to process the first signal to produce a first clock signal and a second clock signal which is different from the first clock signal; (iii) a pulse generator configured to: (a) receive a plurality of M signals having a period TP and of different phases; wherein the period TP is longer than the periods of the first and the second clock signals; (b) based on a control command, to process the second clock signal and one or more of the M signals, to produce a second signal which includes S pulses in each period TP; and (c) process the second signal and the first clock signal to produce the regulating signal so that it includes Q pulses in each period TP, wherein Q is different from S; and (iv) an output interface configured to provide a sub-integer output signal whose frequency is responsive to the regulating signal.

Tables 2A and 2B are table diagrams which illustrate possible division ratio values for the divider circuit 200 of FIG. 6. The division ratio $N_{tot}$ may be expressed as Ntot=A·(P·B·C±1/4·(S+G·b_5)), where $b_5$ indicates whether the second signal was processed using the first clock signal to produce the regulating signal. It is assumed that there are $2^2=4$ phase-shift states between which the phase-rotator rotates.

If, for example, P=37, A=2, B·C=8 and G=24, then the division ration would be Ntot=2·(38.8±1/4·(S+24·b_5)). In this scenario, as may occur in other implementations (depending on the values of the variables in the formula), some states are redundant. That is, the same division ratio may be achieved either with or without injecting additional G pulses (by using different S values). In this example, 96 division ratios are obtained, of which 16 are redundant states.

TABLE 2

| TABLE A | | | | TABLE B | | |
|---|---|---|---|---|---|---|
| Direction | Injection? | Ntot | | Direction | Injection? | Ntot |
| S = 7 CCW | YES | 105 | S = 4 | CCW | YES | 108 |
| S = 6 CCW | YES | 105.5 | S = 3 | CCW | YES | 108.5 |
| S = 5 CCW | YES | 106 | S = 2 | CCW | YES | 109 |
| S = 4 CCW | YES | 106.5 | S = 1 | CCW | YES | 109.5 |
| S = 3 CCW | YES | 107 | S = 4 | CCW | NO | 110 |
| S = 2 CCW | YES | 107.5 | S = 3 | CCW | NO | 110.5 |
| S = 1 CCW | YES | 108 | S = 2 | CCW | NO | 111 |
| S = 7 CCW | NO | 108.5 | S = 1 | CCW | NO | 111.5 |
| S = 6 CCW | NO | 109 | S = 0 | | | 112 |
| S = 5 CCW | NO | 109.5 | S = 1 | CW | NO | 112.5 |
| S = 4 CCW | NO | 110 | S = 2 | CW | NO | 113 |
| S = 3 CCW | NO | 110.5 | S = 3 | CW | NO | 113.5 |
| S = 2 CCW | NO | 111 | S = 4 | CW | NO | 114 |
| S = 1 CCW | NO | 111.5 | S = 1 | CW | YES | 114.5 |
| S = 0 | | 112 | S = 2 | CW | YES | 115 |
| S = 1 CW | NO | 112.5 | S = 3 | CW | YES | 115.5 |
| S = 2 CW | NO | 113 | S = 4 | CW | YES | 116 |
| S = 3 CW | NO | 113.5 | | | | |
| S = 4 CW | NO | 114 | | | | |
| S = 5 CW | NO | 114.5 | | | | |
| S = 6 CW | NO | 115 | | | | |
| S = 7 CW | NO | 115.5 | | | | |
| S = 1 CW | YES | 116 | | | | |
| S = 2 CW | YES | 116.5 | | | | |
| S = 3 CW | YES | 117 | | | | |
| S = 4 CW | YES | 117.5 | | | | |
| S = 5 CW | YES | 118 | | | | |
| S = 6 CW | YES | 118.5 | | | | |
| S = 7 CW | YES | 119 | | | | |

In the example of table 2A, the dividing ratios of integer dividers 210, 233 and 235 are A=2, B=4 ($B_1$=2 and $B_2$=2), and C=2. The division ratio of integer divider 240 (P) is 7, the number of pulses which are included in the second signal, S, ranges between 0 and 7, and the number of pulses which may be added to the second signal by the third-level circuitry is G=7.

In the example of table 2B, the dividing ratios of integer dividers 210, 233 and 235 are A=2, B=4 ($B_1$=2 and $B_2$=2), and C=2. The division ratio of integer divider 240 (P) is 7, the number of pulses which are included in the second signal, S, ranges between 0 and 4, and the number of pulses which may be added to the second signal by the third-level circuitry is G=4.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

It will be appreciated that the embodiments described above are cited by way of example, and various features thereof and combinations of these features can be varied and modified.

While various embodiments have been shown and described, it will be understood that there is no intent to limit the invention by such disclosure, but rather, it is intended to cover all modifications and alternate constructions falling within the scope of the invention, as defined in the appended claims.

What is claimed is:

1. An electronic sub-integer frequency divider circuit, comprising:
   a phase rotator circuit configured to produce a first signal by rotatably outputting, at a rate determined by a control signal, one or more of a plurality of phase-shifted signals having a frequency $f_A$, wherein the frequency of the first signal is determined by the frequency $f_A$ and by the control signal, and wherein the control signal is based on a primary regulating signal;
   a clock circuitry configured to process the first signal thereby producing a first clock signal and a second clock signal, wherein the second clock signal is different from the first clock signal;

a pulse generator configured to:
  receive the first clock signal,
  receive the second clock signal,
  receive a control command,
  process, in accordance with the control command, the second clock signal and at least one M signal having a period TP, thereby producing a second regulating signal which includes S pulses in each period TP, wherein the period TP is longer than the period of the first clock signal and the period of the second clock signal, and
  process the second regulating signal and the first clock signal, thereby producing the primary regulating signal, wherein the primary regulating signal includes Q pulses in each period TP, and wherein Q is different from S; and
an output interface configured to provide a sub-integer output signal whose frequency is responsive to the regulating signal.

2. The electronic sub-integer frequency divider circuit according to claim 1, wherein:
  the electronic sub-integer frequency divider circuit is part of an integrated circuit which further includes an additional unit to which the output signal of the electronic sub-integer frequency divider circuit is provided and which can operate in multiple frequencies;
  wherein the electronic sub-integer frequency divider circuit comprises a prescaler circuit having a dividing factor A, which is configured to receive an input signal of the electronic sub-integer frequency divider circuit and to process it to produce the plurality of phase-shifted signals which comprise differential I (in-phase) and Q (quadrature-phase) phase signals, and which is electrically coupled to the phase rotator circuit for providing the phase-shifted signals to the phase-rotator circuit;
  wherein the phase rotator circuit is further configured to phase interpolate between the plurality of phase-shifted signals output from the prescaler circuit to generate the plurality of phase-shift states having a minimum phase-shift resolution of $\Delta\phi$, and is electrically coupled to a post-scaler integer divider having a dividing factor B which is configured to process the first signal to produce the first clock signal;
  wherein the post-scaler integer divider is electrically coupled to a conversion circuit which converts the first clock signal to match to requirements of CMOS logic, and which is electrically coupled to: the pulse generator for providing the first clock signal to the pulse generator, and to a first CMOS integer divider having a dividing factor C, which is configured to process the converted first clock signal to produce the second clock signal;
  wherein the first CMOS integer divider is electrically coupled to: the pulse generator for providing the second clock signal to the pulse generator, and to a second CMOS integer divider having a dividing factor P;
  wherein the second CMOS integer divider is configured to process the second clock signal to produce the plurality of M signals and to provide one of the M signals as the output signal of the electronic sub-integer frequency divider circuit; wherein the second CMOS integer divider is electrically coupled to the pulse generator for providing the plurality of M signals to the pulse generator;
  wherein the pulse generator is electrically coupled to a phase rotator controller which is configured to generate, based on the rate of pulses in the regulating signal, control signals for the phase rotator circuit; wherein the phase rotator circuit is configured to rotatably output the one or more phase-shift states at a rate determined by the control signals, thereby producing a first signal whose frequency is determined by the frequency $f_A$ and by the control signals;
  wherein the phase rotator controller is electrically coupled to the phase rotator controller via a second conversion circuit which converts the control signals to match to electrical requirements of the phase-rotator circuit.

3. The electronic sub-integer frequency divider circuit according to claim 1, wherein the first clock signal is configured to produce the second clock signal.

4. The electronic sub-integer frequency divider circuit according to claim 1, wherein the pulse generator is configured to produce the regulating signal based on the control command, wherein the regulating signal includes Q pulses in each period TP if the control command fulfils a first criterion, and S pulses in each period TP otherwise.

5. The electronic sub-integer frequency divider circuit according to claim 1, wherein the pulse generator is configured to produce the regulating in accordance with a preconfigured fixed number.

6. The electronic sub-integer frequency divider circuit according to claim 5, further comprising:
  a prescaler circuit having a dividing factor A, being configured to receive an input signal of the electronic sub-integer frequency divider circuit and to process it to produce the plurality of phase-shifted signals from which the phase-shifted states are generated;
  an integer divider having a dividing factor B, being configured to process the first signal to produced the first clock signal;
  an integer divider having a dividing factor C, being configured to process the first clock signal to produce the second clock signal; and
  an integer divider having a dividing factor P, being configured to process the second clock signal to produce the plurality of M signals;
  wherein the electronic sub-integer frequency divider circuit has a sub-integer-dividing factor equal to $A \cdot (BCP + (\Delta\phi/2\pi) \cdot (S+b*G))$, where $\Delta\phi$ denotes a minimum phase shift possible from the phase rotator and where b is equal to 0 if the second signal is used as the regulating signal or 1 if the other signal is used in the producing of the regulating signal, and wherein A, B, C and P are integer values $\geq 1$.

7. The electronic sub-integer frequency divider circuit according to claim 6, wherein the pulse generator is configured to process at least the first clock signal to produce a third signal which includes a preconfigured fixed number Y of pulses; wherein the pulse generator comprises a multiplexer MX2 that is configured to alternate between the second signal and the third signal to produce the regulating signal.

8. The electronic sub-integer frequency divider circuit according to claim 7, wherein the second clock signal clocks the multiplexer MX2.

9. The electronic sub-integer frequency divider circuit according to claim 1, wherein the second clock signal is produced from the first clock signal by an integer frequency divider.

10. The electronic sub-integer frequency divider circuit according to claim 1, wherein the first clock signal and the second clock signal are non-overlapping signals having the same period.

11. The electronic sub-integer frequency divider circuit according to claim 1, wherein the plurality of M signals are produced from the second clock signal by an integer divider that is coupled to the clock circuitry and to the pulse generator.

12. The electronic sub-integer frequency divider circuit according to claim 1, wherein the pulse generator is configured to produce the second regulating signal by selecting up to two signals out of the M signals based on the control command, process the selected M signals by at least one logic gate to produce a third signal with a period TP whose duty cycle corresponds to the control command, and perform a logical AND operation on the third signal with the second clock signal.

13. The electronic sub-integer frequency divider circuit according to claim 1, further comprising a first-level circuitry which comprises a plurality of logical gates and a multiplexer MX1 which is clocked by the second clock signal; wherein the first-level circuitry is configured to receive as input one or more of the M signals and to selectively output, based on the control command, each out of a plurality of L possible periodic pulses of different duty cycles and with a period TP.

14. The electronic sub-integer frequency divider circuit according to claim 13, wherein for two of more of the plurality of L possible periodic pulses the multiplexer MX1 is configured to output one of the periodic pulse by selecting, in response to the control command, a signal provided to the multiplexer MX1 by one of the plurality of the logical gates which processes two of the M signals to produce the periodic pulse.

* * * * *